US012626115B2

(12) United States Patent
Jung et al.

(10) Patent No.: US 12,626,115 B2
(45) Date of Patent: May 12, 2026

(54) PROCESSING DEVICE AND ELECTRONIC DEVICE HAVING THE SAME

(71) Applicant: Samsung Electronics Co., Ltd., Suwon-si (KR)

(72) Inventors: Seungchul Jung, Suwon-si (KR); Sangjoon Kim, Hwaseong-si (KR); Sungmeen Myung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1449 days.

(21) Appl. No.: 17/194,571

(22) Filed: Mar. 8, 2021

(65) Prior Publication Data

US 2022/0019884 A1    Jan. 20, 2022

(30) Foreign Application Priority Data

Jul. 20, 2020    (KR) ......................... 10-2020-0089853
Jan. 7, 2021    (KR) ......................... 10-2021-0002215

(51) Int. Cl.
*G11C 11/4094*    (2006.01)
*G06G 7/16*    (2006.01)
(Continued)

(52) U.S. Cl.
CPC .......... *G06N 3/065* (2023.01); *G11C 11/4094* (2013.01); *H10B 61/22* (2023.02); *G06G 7/16* (2013.01); *G06N 3/048* (2023.01)

(58) Field of Classification Search
CPC ...... G06G 7/16; G11C 2213/76; H10N 50/10; H10B 61/00; H10B 61/22; H10B 63/00–845
See application file for complete search history.

(56) References Cited

U.S. PATENT DOCUMENTS 8,264,052 B2    9/2012  Xia
8,441,850 B2 *  5/2013  Lee ...................... G11C 11/165
365/171
(Continued)

FOREIGN PATENT DOCUMENTS

CN    105448949 A    3/2016
CN    108921290 A    11/2018
(Continued)

OTHER PUBLICATIONS

Korean Office Action Issued on Dec. 9, 2024, in Counterpart Korean Patent Application No. 10-2020-0089853 (5 Pages in English, 5 Pages in Korean).
(Continued)

*Primary Examiner* — Andrew Caldwell
*Assistant Examiner* — Huy Duong
(74) *Attorney, Agent, or Firm* — NSIP Law

(57) ABSTRACT

A processing device includes: a plurality of bitcells, each of the plurality of bitcells including: a variable resistor layer including a plurality of active variable resistors and a plurality of inactive variable resistors; an active layer including a plurality of switches configured to control either one of a voltage to be applied between ends of each of the active variable resistors and a current flowing to each of the active variable resistors; and a plurality of metal layers including wires electrically connecting the active variable resistors to the switches, wherein at least one of the plurality of bitcells includes a via penetrating through the variable resistor layer and connecting at least one of the switches to at least one of the active variable resistors.

40 Claims, 18 Drawing Sheets

(51) Int. Cl.

| | |
|---|---|
| *G06N 3/065* | (2023.01) |
| *H10B 61/00* | (2023.01) |
| *G06N 3/048* | (2023.01) |

(56) References Cited

U.S. PATENT DOCUMENTS

| | | | |
|---|---|---|---|
| 9,196,341 | B2 | 11/2015 | Kim et al. |
| 9,496,314 | B1 * | 11/2016 | Lu .......................... H10N 50/10 |
| 9,734,880 | B1 | 8/2017 | Augustine et al. |
| 10,175,947 | B1 | 1/2019 | Marukame et al. |
| 2010/0232210 | A1 | 9/2010 | Kajiyama et al. |
| 2011/0032749 | A1 | 2/2011 | Liu et al. |
| 2012/0243286 | A1 | 9/2012 | Inaba |
| 2013/0235639 | A1 | 9/2013 | Lee et al. |
| 2015/0187393 | A1 * | 7/2015 | Ueda ................... G11C 13/0004 |
| | | | 365/72 |
| 2016/0087005 | A1 | 3/2016 | Philippou et al. |
| 2018/0040807 | A1 | 2/2018 | Saito et al. |
| 2018/0144240 | A1 | 5/2018 | Garbin et al. |
| 2019/0088289 | A1 * | 3/2019 | Ishii ....................... G11C 13/003 |
| 2019/0102170 | A1 | 4/2019 | Chen et al. |
| 2019/0122102 | A1 | 4/2019 | Leobandung |
| 2019/0123099 | A1 | 4/2019 | Lee |
| 2019/0180173 | A1 | 6/2019 | Torng et al. |
| 2019/0206469 | A1 | 7/2019 | Trinh Quang et al. |
| 2019/0220249 | A1 | 7/2019 | Lee et al. |
| 2019/0236445 | A1 | 8/2019 | Das et al. |
| 2019/0272870 | A1 | 9/2019 | Choi et al. |
| 2019/0286419 | A1 | 9/2019 | Lin et al. |
| 2019/0363251 | A1 | 11/2019 | Williams |
| 2019/0385049 | A1 | 12/2019 | Yang et al. |
| 2020/0118619 | A1 * | 4/2020 | Narayanan ............. G06N 3/084 |
| 2020/0135720 | A1 | 4/2020 | Brewer |
| 2020/0241842 | A1 * | 7/2020 | Cheng ...................... G11C 7/24 |
| 2020/0311533 | A1 * | 10/2020 | Agrawal .............. G11C 13/003 |
| 2025/0200350 | A1 * | 6/2025 | Ezzadeen ............... G06N 3/063 |

FOREIGN PATENT DOCUMENTS

| | | | |
|---|---|---|---|
| CN | 109712657 | A | 5/2019 |
| CN | 109979516 | A | 7/2019 |
| EP | 3 671 750 | A1 | 6/2020 |
| JP | 2009-94226 | A | 4/2009 |
| JP | 2010-219098 | A | 9/2010 |
| JP | 2012-203964 | A | 10/2012 |
| JP | 5077732 | B2 | 11/2012 |
| JP | 2013-539917 | A | 10/2013 |
| JP | 2018-22796 | A | 2/2018 |
| JP | 2019-53563 | A | 4/2019 |
| KR | 10-1424663 | B1 | 7/2014 |

OTHER PUBLICATIONS

Korean Office Action Issued on Dec. 10, 2024, in Counterpart Korean Patent Application No. 10-2021-0002215 (6 Pages in English, 6 Pages in Korean).

Japanese Office Action Issued on May 20, 2025, in Counterpart Japanese Patent Application No. 2021-105056 (7 Pages in English, 6 Pages in Japanese).

Extended European Search Report issued on Dec. 14, 2021 in counterpart International European Patent Application No. 21184664.7 (10 pages in English).

Extended European Search Report issued on Dec. 17, 2021 in counterpart International European Patent Application No. 21183095.5 (12 pages in English).

Japanese Office Action Issued on Mar. 18, 2025, in Counterpart Japanese Patent Application No. 2021-105060 (10 Pages in English, 8 Pages in Japanese).

Chinese Office Action Issued on Apr. 1, 2025, in Counterpart Chinese Patent Application No. 202110472221.9 (16 Pages in English, 10 Pages in Chinese).

European Office Action Issued on Apr. 16, 2024, in Counterpart European Patent Application No. 21183095.5 (10 Pages in English).

Chinese Office Action issued on Nov. 26, 2025, in counterpart Chinese Patent Application No. 202110447281.5 (24 pages in English, 17 pages in Chinese).

* cited by examiner

20

Input layer

Hidden layer 1

Hidden layer 2

Output layer

21

22

$$y_i = f\left(\sum_{j=1}^{m} w_{ji} \cdot x_j\right)$$

FIG. 9B

PROCESSING DEVICE AND ELECTRONIC DEVICE HAVING THE SAME

CROSS-REFERENCE TO RELATED APPLICATION

This application claims the benefit under 35 U.S.C. § 119(a) of Korean Patent Application No. 10-2020-0089853, filed on Jul. 20, 2020, and Korean Patent Application No. 10-2021-0002215, filed on Jan. 7, 2021, in the Korean Intellectual Property Office, the entire disclosures of which are incorporated herein by reference for all purposes.

BACKGROUND

1. Field

The following description relates to a processing device and an electronic device having the processing device.

2. Description of the Related Art

Neural network devices may perform a multiply-accumulate (MAC) operation of repeating multiplications and additions. A neural network may repeatedly perform a MAC operation of multiplying the values of nodes of a previous layer with weights mapped to the nodes and adding multiplication results at a specific node, and may perform an operation of applying an activation function to a result of the MAC operation. To this end, a memory access operation of loading an appropriate input and weight at a desired or determined time point may also be performed. However, such neural network operations, such as the MAC operation, may not be efficiently performed using other hardware architecture instead of a generally known digital computer.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a processing device includes: a plurality of bitcells, each of the plurality of bitcells including: a variable resistor layer including a plurality of active variable resistors and a plurality of inactive variable resistors; an active layer including a plurality of switches configured to control either one of a voltage to be applied between ends of each of the active variable resistors and a current flowing to each of the active variable resistors; and a plurality of metal layers including wires electrically connecting the active variable resistors to the switches, wherein at least one of the plurality of bitcells includes a via penetrating through the variable resistor layer and connecting at least one of the switches to at least one of the active variable resistors.

Configurations of the via, the active variable resistors, and the inactive variable resistors of adjacent bitcells among the at least one of the bitcells may be symmetrical with each other about a boundary between the adjacent bitcells.

Each of the plurality of bitcells respectively may include the via.

The plurality of bitcells may include serially connected bitcells, and the serially connected bitcells may include one via for every two adjacent bitcells.

The plurality of bitcells may include 64 or more serially connected bitcells.

The plurality of bitcells may form a bitcell array including 64 or more bitcell lines, and each of the bitcell lines may include serially connected bitcells from among the bitcells.

At least one of the switches of each of the bitcells may include a common source and two electrically connected drains.

The processing device may be an in-memory processing unit.

An electronic device may include: the processing device, wherein the processing device is a neural network device; and a processor configured to control a function of the neural network device.

In another general aspect, a processing device includes: a variable resistor layer including a plurality of active variable resistors; an active layer including a plurality of switches configured to control either one of a voltage to be applied between ends of each of the active variable resistors and a current flowing to each of the active variable resistors; and a plurality of metal layers including wires electrically connecting the active variable resistors to the switches, wherein the variable resistor layer may include at least one via penetrating through the variable resistor layer and connecting at least one of the switches to at least one of the active variable resistors.

The metal layers may include a metal layer stacked on the variable resistor layer and including a wire connecting an upper end portion of the via to an upper end portion of at least one of the active variable resistors.

The variable resistor layer further may include inactive variable resistors not electrically connected to the switches, and a minimum distance between the at least one via and the active variable resistors may be greater than a minimum distance between the at least one via and the inactive variable resistors.

The variable resistor layer may include a plurality of vias, and a minimum distance between vias may be less than the minimum distance between the at least one via and the inactive variable resistors.

The minimum distance between the at least one via and the inactive variable resistors may be greater than both a minimum distance between the inactive variable resistors and a minimum distance between the inactive variable resistors and the active variable resistors.

The variable resistor layer may include a plurality of vias, and a minimum distance between the vias may be substantially within 0.10 μm to 0.40 μm.

The minimum distance between the at least one via and the active variable resistors may be substantially within 0.50 μm to 1.20 μm.

The minimum distance between the at least one via and the inactive variable resistors may be substantially within 0.30 μm to 0.60 μm.

Each of the active variable resistors may be a magnetic tunnel junction (MTJ) device.

An electronic device may include: the processing device, wherein the processing device is a neural network device; and a processor configured to control a function of the neural network device.

In another general aspect, an electronic device includes: a neural network device; and a processor configured to control a function of the neural network device, wherein the neural network device may include a plurality of bitcells, each of the plurality of bitcells including: a variable resistor layer including a plurality of active variable resistors and a plurality of inactive variable resistors; an active layer including a plurality of switches configured to control either one of a voltage to be applied to ends of each of the active variable resistors and a current flowing to each of the active variable resistors; and a plurality of metal layers including wires electrically connecting the active variable resistors to the switches, and wherein at least one of the plurality of bitcells may include a via penetrating through the variable resistor layer and connecting at least one of the switches to at least one of the active variable resistors.

Configurations of the via, the active variable resistors, and the inactive variable resistors of adjacent bitcells among the at least one of the bitcells may be symmetrical with each other about a boundary between the adjacent bitcells.

Each of the bitcells may include two of the active variable resistors connected to each other in parallel and two of the switches serially connected to the active variable resistors, respectively.

Each of the plurality of bitcells respectively may include the via.

The plurality of bitcells may include serially connected bitcells, and the serially connected bitcells may include one via for every two adjacent bitcells.

The plurality of bitcells may include 64 or more serially connected bitcells.

The plurality of bitcells may form a bitcell array including 64 or more bitcell lines, and each of the bitcell lines may include serially connected bitcells from among the bitcells.

At least one of the switches of each of the bitcells may include a common source and two electrically connected drains.

In another general aspect, an electronic device includes: a neural network device; and a processor configured to control a function of the neural network device, wherein the neural network device may include: a variable resistor layer including a plurality of active variable resistors and a plurality of inactive variable resistors; an active layer including a plurality of switches configured to control either one of a voltage to be applied to both ends of each of the active variable resistors and a current flowing to each of the active variable resistors; and a plurality of metal layers including wires electrically connecting the active variable resistors to the switches, and the variable resistor layer may include at least one via penetrating through the variable resistor layer and connecting at least one of the switches to at least one of the active variable resistors.

The metal layers may include a metal layer stacked on the variable resistor layer and including a wire connecting an upper end portion of the via to an upper end portion of at least one of the active variable resistors.

The variable resistor layer further may include inactive variable resistors not electrically connected to the switches, and a minimum distance between the at least one via and the active variable resistors may be greater than a minimum distance between the at least one via and the inactive variable resistors.

The variable resistor layer may include a plurality of vias, and a minimum distance between vias may be less than the minimum distance between the at least one via and the inactive variable resistors.

The minimum distance between the at least one via and the inactive variable resistors may be greater than both a minimum distance between the inactive variable resistors and a minimum distance between the inactive variable resistors and the active variable resistors.

The variable resistor layer may include a plurality of vias, and a minimum distance between the vias may be substantially within 0.10 μm to 0.40 μm.

The minimum distance between the at least one via and the active variable resistors may be substantially within 0.50 μm to 1.20 μm.

The minimum distance between the at least one via and the inactive variable resistors may be substantially within 0.30 μm to 0.60 μm.

Each of the active variable resistors may be a magnetic tunnel junction (MTJ) device.

In another general aspect, a processing device includes: a plurality of bitcells, wherein at least one of the bitcells may include: a plurality of active variable resistors and a plurality of inactive variable resistors; a plurality of switches configured to control either one of a voltage to be applied to the active variable resistors and a current flowing to the active variable resistors; and a via connecting at least one of the switches to at least one of the active variable resistors, wherein the via is distanced further from the active variable resistors than the inactive variable resistors.

The plurality of bitcells may include an array of active variable resistors and inactive variable resistors including the active variable resistors and the inactive variable resistors of the at least one of the bitcells, the active variable resistors of the array may be disposed at a center of the array, and the inactive variable resistors of the array may surround the active variable resistors of the array.

The array may be symmetrical about boundaries between adjacent bitcells of the plurality of bitcells.

At least two bitcells of the plurality of bitcells may be of a bitcell line, and at least two other bitcells of the plurality of bitcells may be of another bitcell line, and the bitcell line may be configured to perform operations of a node of a layer of a neural network, and the other bitcell line may be configured to perform operations of another node of the layer of the neural network.

In another general aspect, a bitcell circuit includes: a first variable resistor as a resistive memory device having a resistance value that is set based on the resistive memory device switching between different resistance states; a second variable resistor as another resistive memory device connected to the first variable resistor in parallel, wherein the second variable resistor is set with a resistance value complementary to the resistance value of the first variable resistor; a first switch serially connected to the first variable resistor and configured to switch application of a voltage or current to the first variable resistor; and a second switch serially connected to the second variable resistor and configured to perform a switching operation for applying the voltage or current to the first variable resistor, complementarily to the first switch.

The first variable resistor may be set with either one of a first resistance value and a second resistance value, and the second variable resistor may be set with the second resistance value when the first variable resistor is set with the first resistance value, and is set with the first resistance value when the first variable resistor is set with the second resistance value.

The resistance values of the first variable resistor and the second variable resistor may be set with values corresponding to weights for a multiply and accumulate (MAC) operation.

The first switch and the second switch may complementarily perform on/off operations according to an input value applied to the bitcell circuit to perform a MAC operation of a neural network.

A resistance value of the bitcell circuit may be equal to the resistance value of the first variable resistor when the first switch is closed by application of a first input value, and may be equal to the resistance value of the second variable resistor when the second switch is closed by application of a second input value.

A resistance value of the bitcell circuit may be a first resistance value when the first variable resistor is set with the first resistance value corresponding to a first weight and a first input value is applied to the bitcell circuit, a resistance value of the bitcell circuit may be the first resistance value when the first variable resistor is set with the second resistance value corresponding to a second weight and the second input value is applied to the bitcell circuit, a resistance value of the bitcell circuit may be the second resistance value when the first variable resistor is set with the second resistance value corresponding to the second weight and the first input value is applied to the bitcell circuit, and a resistance value of the bitcell circuit may be the second resistance value when the second variable resistor is set with the second resistance value corresponding to the first weight and the second input value is applied to the bitcell circuit.

The bitcell circuit may have a resistance value corresponding to a result of an exclusive-NOR (XNOR) operation between the input value applied to the bitcell circuit and a weight set for the bitcell circuit.

The first variable resistor and the first switch serially connected to each other may be are parallelly connected with the second variable resistor and the second switch serially connected to each other, one end of the first variable resistor and one end of the second variable resistor may be commonly connected to a first bit data line, and one end of the first switch and one end of the second switch may be commonly connected to a second bit data line.

Another bitcell circuit may be connected to either one of: the one end of the first variable resistor and the one end of the second variable resistor commonly connected to the first bit data line; and the one end of the first switch and the one end of the second switch commonly connected to the second bit data line is connected to.

The first variable resistor and the second variable resistor may be magnetic tunnel junction (MTJ) devices.

A processing device may include a bitcell array including a plurality of bitcells including the bitcell circuit.

A processing device may include: a variable resistor layer including the variable resistors; an active layer including the switches; and a plurality of metal layers including wires electrically connecting the variable resistors to the switches, wherein the variable resistor layer comprises at least one via penetrating through the variable resistor layer and connecting at least one of the switches to at least one of the variable resistors.

In another general aspect, a bitcell circuit includes: a pair of variable resistors as resistive memory devices set to have different resistance values and connected to each other in parallel; and a pair of switches serially connected to the variable resistors, respectively, and configured to complementarily switch applications of a voltage or current to the variable resistors.

In another general aspect, a processing device includes: a bitcell array including a plurality of bitcells each including a pair of variable resistors and a pair of switches, wherein at least one of the plurality of bitcells includes: a first variable resistor as a resistive memory device having a resistance value set based on the resistive memory device switching between different resistance states; a second variable resistor as another resistive memory device connected to the first variable resistor in parallel, wherein the second variable resistor is set with a resistance value complementary to the resistance value of the first variable resistor; a first switch serially connected to the first variable resistor and configured to switch application of a voltage or current to the first variable resistor; and a second switch serially connected to the second variable resistor and configured to perform a switching operation for applying the voltage or current to the first variable resistor, complementarily to the first switch.

The plurality of bitcells may form the bitcell array including a plurality of bitcell lines, and each of the plurality of bitcell lines may include serially connected bitcells from among the plurality of bitcells.

A first bitcell line from among the plurality of bitcell lines may be configured to perform processing of a MAC operation of a first node from among a plurality of nodes of a neural network, and the pair of variable resistors included in each of bitcells of the first bitcell line may be set with resistance values corresponding to weights for the MAC operation of the first node.

In each of the bitcells included in the first bitcell line, one switch of the pair of switches may be closed and another switch of the pair may be opened, based on input values of the MAC operation of the first node.

A result of the MAC operation of the first node may correspond to a value of a voltage drop of the first bitcell line that occurs due to a predetermined value of current applied to the first bitcell line, in response to the setting of the resistance values corresponding to the weights and switching operations of the switches corresponding to the input value.

A value of the voltage drop of the first bitcell line may correspond to a sum of values of voltage drops occurring in the bitcells included in the first bitcell line.

The processing device further may include a pair of bit data lines connected between one or more of the bitcells and configured to apply a voltage or current to both ends of the one or more of the bitcells, to set resistance values of the pair of variable resistors.

The processing device may be a device that performs in-memory processing.

In another general aspect, a processing device including a bitcell array, the processing device includes: a plurality of bitcells; and a pair of bit data lines connected between one or more of the bitcells and configured to apply a voltage or current to both ends of the one or more of the bitcells, wherein at least one of the plurality of bitcells includes: a pair of variable resistors as resistive memory devices set to have different resistance values according to switching between different resistance states and connected to each other in parallel; and a pair of switches serially connected to the variable resistors, respectively, and configured to complementarily switch applications of a voltage or current to the variable resistors.

Other features and aspects will be apparent from the following detailed description, the drawings, and the claims.

BRIEF DESCRIPTION OF THE DRAWINGS

FIG. 9B illustrates an example of a vertical cross-sectional view of bitcells;

DETAILED DESCRIPTION

Figure 1:
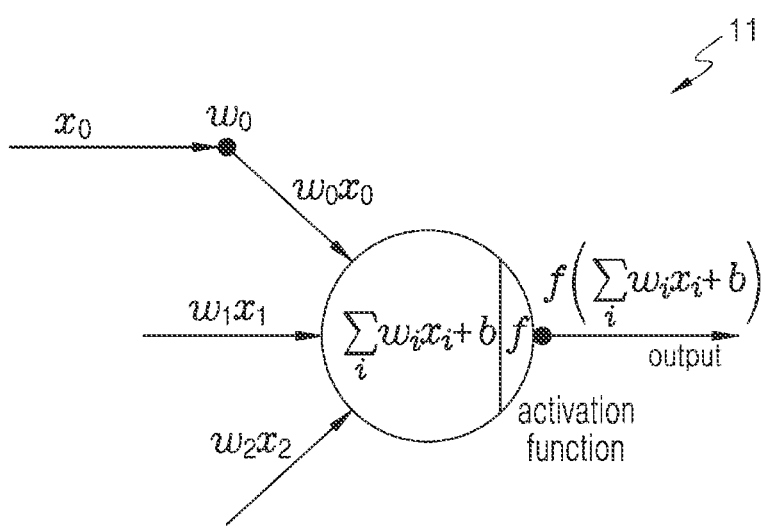
FIG. 1 illustrates a neural network node model according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art, after an understanding of the disclosure of this application, may be omitted for increased clarity and conciseness.

Reference will now be made in detail to embodiments, examples of which are illustrated in the accompanying drawings, wherein like reference numerals refer to the like elements throughout. In this regard, the one or more embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

In addition, terms such as first, second, A, B, (a), (b), and the like may be used herein to describe components. Each of these terminologies is not used to define an essence, order, or sequence of a corresponding component but used merely to distinguish the corresponding component from other component(s). Although terms of "first" or "second" are used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The embodiments described below relate to a technical field of a processing device, for example, a neuromorphic processor or a neural processor, and detailed descriptions on items that are well-known may be omitted.

According to embodiments, a processing device of one or more embodiments may be provided with an analog circuit for processing multiplication and addition operations, unlike a general digital computer in which information is exchanged by using a common data bus. In other words, the processing device may perform in-memory processing or internal processing.

Accordingly, the processing device may be referred to as various terms such as an in-memory processing device, a processor in memory (PIM), and a function in memory (FIM).

FIG. 1 illustrates a neural network node model according to one or more embodiments.

The neural network node model 11 may include, as an example of neuromorphic computations, a multiplication computation that multiplies information from a plurality of neurons or nodes by a synaptic weight, an addition computation Y for values $\omega_0 x_0$, $\omega_1 x_1$, $\omega_2 x_2$ obtained by multiplying the synaptic weight, and a computation for applying a characteristic function b and an activation function f to a result of the addition computation. A neuromorphic computation result may be provided by a neuromorphic computation. Here, values like $x_0$, $x_1$, $x_2$, and so on correspond to axon values, and values like $\omega_0$, $\omega_1$, $\omega_2$, and so on correspond to synaptic weights. While the nodes, values, and weights of the neural network node model 11 may be respectively referred to as "neurons," "axon values," and "synaptic weights," such reference is not intended to impart any relatedness with respect to how the neural network architecture computationally maps or thereby intuitively recognizes information and how a human's neurons operate. I.e., the terms are merely terms of art referring to the hardware implemented nodes, values, and weights of the neural network node model 11.

Figure 2:
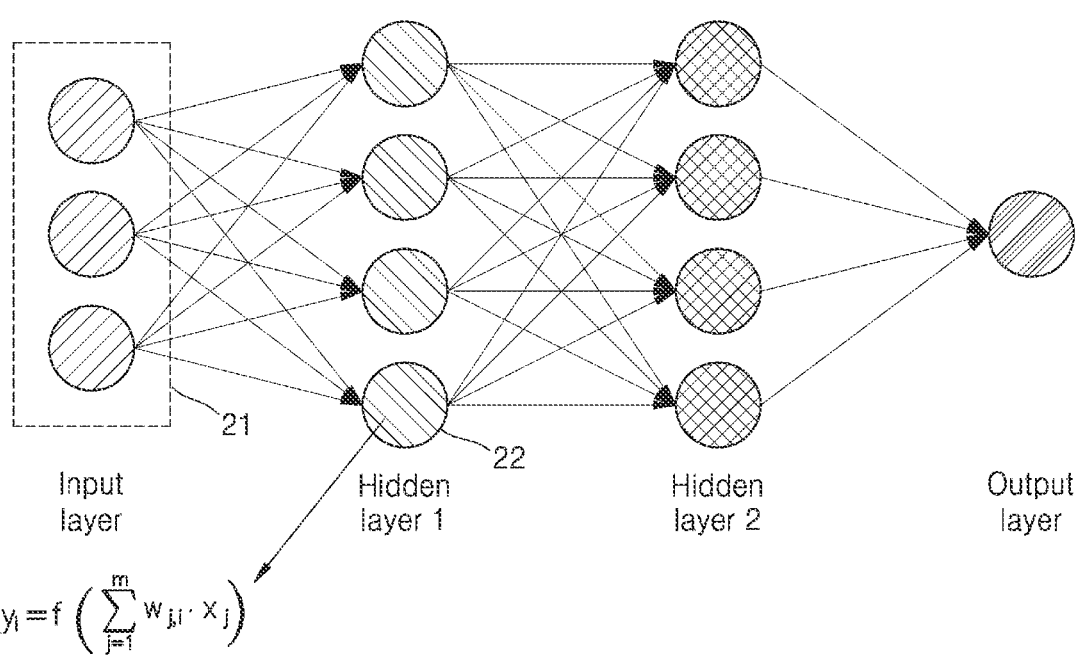
FIG. 2 illustrates an example of a neural network.

FIG. 2 illustrates an example of a neural network (e.g., a neural network 20).

Referring to FIG. 2, the neural network 20 is an example of a neural network that implements the above-described neural network node model, and may correspond to a deep neural network (DNN). Although, for convenience of explanation, the neural network 20 is illustrated as including two hidden layers (e.g., hidden layer 1 and hidden layer 2), the neural network 20 may include various numbers of hidden layers (e.g., three or more hidden layers). Furthermore, although FIG. 2 illustrates that the neural network 20 separately includes an input layer 21 for receiving input data, the input data may be directly input to the hidden layers.

In the neural network 20, nodes of layers, except an output layer, may be connected to nodes of a next layer through links for transmitting an output signal. Values obtained by multiplying node values of nodes included in the previous layer by weights respectively allocated to the links may be input to one node through the links. The node values of the previous layer may correspond to axon values and the weights correspond to synaptic weights. Each weight may be referred to as a parameter of the neural network 20. An activation function may include a sigmoid, a hyperbolic tangent (tanh), and a rectified linear unit (ReLU), and non-linearity may be formed in the neural network 20 by the activation function.

The output of any one node 22 included in the neural network 20 may be expressed as in Equation 1 below, for example.

$$y_i = f\left(\sum_{j=1}^{m} w_{j,i} x_j\right) \qquad \text{Equation 1}$$

Equation 1 may represent an output value $y_i$ of the i-th node 22 with respect to m input values in any layer. In Equation 1 $x_j$ may denote an output value of the j-th node of a previous layer, and $w_{j,i}$ may denote a weight applied to a connection between the j-th node of the previous layer and the i-th node 22 of a current layer. Also, f( ) may denote an activation function. As shown in Equation 1, an accumulated result of multiplications of the input value $x_j$ and the weight $w_{j,i}$ may be used with respect to the activation function. In other words, a multiply-accumulate (MAC) operation of multiplying and adding an appropriate input value $x_j$ and weight $w_{j,i}$ at a desired or determined time point may be repeated. In addition to the above use, there are various application fields using the MAC operation. To this end, a processing device capable of processing the MAC operation in an analog circuit domain may be used.

Figure 3:
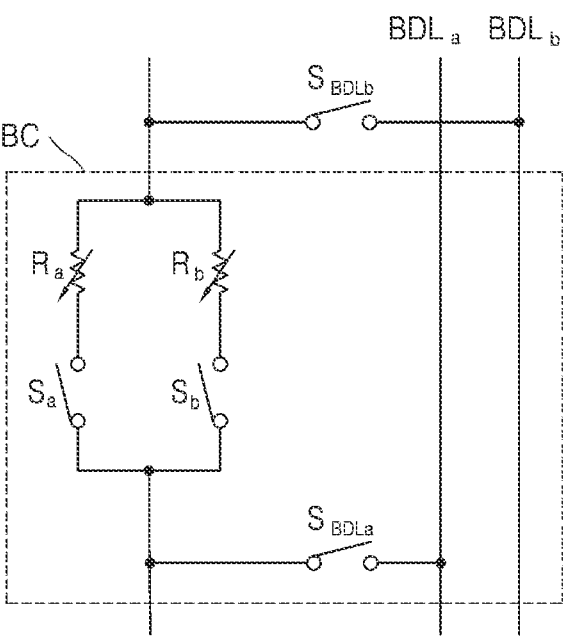
FIG. 3 illustrates an example of a circuit diagram of a bitcell used in a processing device.

FIG. 3 illustrates an example of a circuit diagram of an embodiment of a bitcell BC used in a processing device. A structure and operation of the bitcell BC will now be described with reference to FIG. 3.

The bitcell BC of FIG. 3 may have a circuit structure included in a processing device for implementing a neuromorphic processor, a neural processor, or the like. The processing device may be, for example, an in-memory processing unit that stores data in a memory (resistive memory device or the like) and uses the stored data when an operation is necessary.

The bitcell BC may include a pair of variable resistors $R_a$ and $R_b$ connected to each other in parallel, a pair of switches $S_a$ and $S_b$ serially connected to the variable resistors $R_a$ and $R_b$, respectively, and switches $S_{BDLa}$ and $S_{BDLb}$ connected to first and second bit data lines BDLa and BDLb, respectively. However, the circuit structure of the bitcell BC of FIG. 3 is only an example, and the bitcell BC may be implemented by an equivalent circuit using different circuit devices.

The pair of variable resistors $R_a$ and $R_b$ may be resistors that may be set with different resistance values, and the resistance values of the variable resistors $R_a$ and $R_b$ may be determined by a weight that is applied to the bitcell BC. For example, each of the variable resistors $R_a$ and $R_b$ may have one of two resistance values, for example, a resistance value of $20\Omega$ or $5\Omega$. For example, when a weight applicable to the bitcell BC is −1 or 1, and when the weight of '1' is applied to the bitcell BC, the first variable resistor $R_a$ may be set to be $20\Omega$ and the second variable resistor $R_b$ may be set to be $5\Omega$. On the other hand, when a weight of '−1' is applied to the bitcell BC, the first variable resistor $R_a$ may be set to be $5\Omega$ and the second variable resistor $R_b$ may be set to be $20\Omega$. In other words, the resistance values of the variable resistors $R_a$ and $R_b$ may be complementarily set such that the variable resistors $R_a$ and $R_b$ have different resistance values.

In detail, the variable resistors $R_a$ and $R_b$ may be resistive memory devices. The resistive memory device may be switchable between different resistance states according to voltages or currents applied to both ends of the resistive memory device, and thus may have a plurality of resistance states. The resistive memory device may have a single-layered structure or multi-layered structure including, for example, a transition metal oxide, a metal oxide such as a perovskite material, a phase change material such as a chalcogenide material, a ferroelectric material, a ferromagnetic material, etc. Meanwhile, an operation in which the resistive memory device changes from a high resistance state to a low resistance state may be referred to as a SET operation, and an operation in which the resistive memory device changes from a low resistance state to a high resistance state may be referred to as a RESET operation.

A method of changing the resistance values of the variable resistors $R_a$ and $R_b$ will now be described. First, one end of a variable resistor to be changed may be connected to the first bit-data line BDLa and another end of the variable resistor may be connected to the second bit-data line BDLb. When illustrating and describing the first variable resistor $R_a$, one end of the first variable resistor $R_a$ (upper end of the variable resistor $R_a$ in FIG. 3) may be connected to the second bit-data line BDLb through the upper bit-data line switch $S_{BDLb}$, and the other end of the first variable resistor $R_a$ (lower end of the variable resistor $R_a$ in FIG. 3) may be connected to the first bit-data line BDLa through the first switch $S_a$ and the lower bit-data line switch $S_{BDLa}$.

In an example, the upper bit-data line switch $S_{BDLb}$ may not be included in the bitcell BC of FIG. 3. For example, the upper bit-data line switch $S_{BDLb}$ may be a switch included in a bitcell (not shown) adjacent to the bitcell BC of FIG. 3, or an independent switch not included in any bitcell.

When the first variable resistor $R_a$ is connected to the bit data lines BDLa and BDLb, a SET operation or a RESET operation may be performed with respect to the first variable resistor $R_a$ by controlling a voltage on both ends of the first variable resistor $R_a$ or a current flowing in the first variable resistor R$_a$ through the bit data lines BDLa and BDLb. However, when the second switch S$_b$ and the bit-data line switches S$_{BDLa}$ and S$_{BDLb}$ on both ends of the bitcell BC are closed, the second variable resistor R$_b$ may be connected to the bit data lines BDLa and BDLb, and thus a SET operation or a RESET operation may be performed with respect to the second variable resistor R$_b$.

A voltage and/or current applied to change the resistance values of the variable resistors R$_a$ and R$_b$ may be much greater than a voltage and/or current applied to read the resistance values of the variable resistors R$_a$ and R$_b$. In other words, the voltage and/or current applied to read the resistance values of the variable resistors R$_a$ and R$_b$ may not change (or have a negligible effect on) the resistance values of the variable resistors R$_a$ and R$_b$.

The pair of switches S$_a$ and S$_b$ serially connected respectively to the variable resistors R$_a$ and R$_b$ may perform an ON/OFF operation according to what input is applied to the bitcell BC. The switches S$_a$ and S$_b$ may complementarily operate so that, when one switch is closed, the other switch is open. For example, when an input applicable to the bitcell BC is '−1' or '1', it may be designed that, when the input of '1' is applied, the first switch S$_a$ is closed and the second switch S$_b$ is open, and when the input of '−1' is applied, the first switch S$_a$ is open and the second switch S$_b$ is closed.

According to the above-described operation methods of a variable resistor and a switch, resistance values measured from both ends of the bitcell BC of FIG. 3 may vary according to weights and inputs applied to the bitcell BC. A relationship between a weight, an input, and a resistance value on both ends of the bitcell BC may be summarized in Table 1 below, for example.

TABLE 1

| Input | Weight | Input * Weight | Resistance Value (Ω) |
|---|---|---|---|
| 1. | 1. | 1. | 20. |
| 1. | −1. | −1. | 5. |
| −1. | 1. | −1. | 5. |
| −1. | −1. | 1. | 20. |

Referring to Table 1, when a product of the input and the weight is 1, the resistance value of the bitcell BC is 20Ω, and, when the product of the input and the weight is −1, the resistance value of the bitcell BC is 5Ω. In other words, when the resistance value of the bitcell BC is measured or a voltage drop of the bitcell BC due to a current having a constant value is measured, a product of an input and a weight applied to the bitcell BC may be determined. A processing device (for example, a neuromorphic processor) that obtains a sum of the products of inputs and weights may be implemented by using the characteristics of the bitcell BC.

Figure 4A:
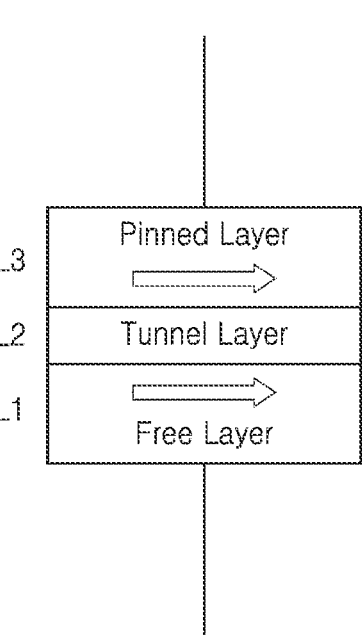
FIGS. 4A and 4B illustrate examples of a structure and operation of a variable resistor applied to a bitcell.
Figure 4B:
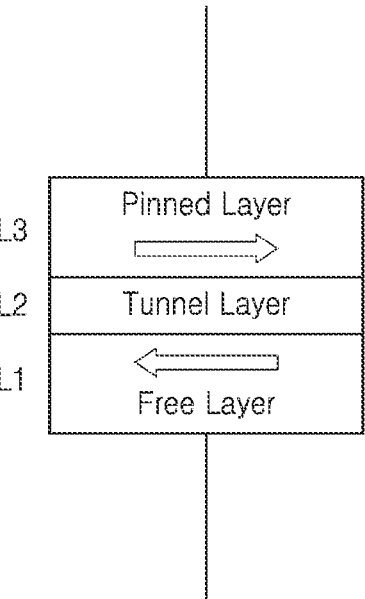

FIGS. 4A and 4B illustrate examples of a structure and operation of a variable resistor applied to a bitcell (e.g., the bitcell BC of FIG. 3). The variable resistors R$_a$ and R$_b$ may be implemented as magnetic tunnel junction (MTJ) devices, and may each have a resistance value that varies according to the magnitude and direction of a current (or voltage) and may exhibit a non-volatile feature of keeping the resistance value unchanged even when an input current (or voltage) is cut off.

Referring to FIGS. 4A and 4B, an MTJ device may include a pinned layer L3, a free layer L1, and a tunnel layer L2 therebetween. A magnetization direction of the pinned layer L3 is fixed, and a magnetization direction of the free layer L1 may be the same as or different from the magnetization direction of the pinned layer L3 according to conditions.

FIG. 4A illustrates that the magnetization directions of the free layer L1 and the pinned layer L3 are parallel to each other in the MTJ device. When the magnetization directions are parallel as above, the MTJ device may have a low resistance value (for example, a resistance value of 5Ω). FIG. 4B illustrates that the magnetization directions of the free layer L1 and the pinned layer L3 in the MTJ device are anti-parallel to each other. When the magnetization directions are anti-parallel as above, the MTJ device may have a high resistance value (for example, a resistance value of 20Ω). Accordingly, the resistance value of the variable resistor may be changed by changing the magnetization direction of the free layer L1.

The magnetization direction of the free layer L1 may be changed by an electrical/magnetic factor provided inside and/or outside a resistive memory cell. The free layer L1 may include a material having a changeable magnetization direction (for example, a ferromagnetic material).

The free layer L1 may include, for example, CoFeB, FeB, Fe, Co, Ni, Gd, Dy, CoFe, NiFe, MnAs, MnBi, MnSb, CrO$_2$, MnOFe$_2$O$_3$, FeOFe$_2$O$_3$, NiOFe$_2$O$_3$, CuOFe$_2$O$_3$, MgOFe$_2$O$_3$, EuO, Y$_3$Fe$_5$O$_{12}$, and/or a combination thereof.

The tunnel layer L2 may have a thickness thinner than a spin diffusion distance and may include a non-magnetic material (for example, magnesium (Mg), titanium (Ti), aluminum (Al), magnesium-zinc (MgZn), and oxides of magnesium-boron (MgB), titanium (Ti), vanadium (V), and/or a combination thereof).

The pinned layer L3 may have a magnetization direction fixed by an anti-ferromagnetic layer. The pinned layer L3 may include a ferromagnetic material (for example, CoFeB, FeB, Fe, Co, Ni, Gd, Dy, CoFe, NiFe, MnAs, MnBi, MnSb, CrO$_2$, MnOFe$_2$O$_3$, FeOFe$_2$O$_3$, NiOFe$_2$O$_3$, CuOFe$_2$O$_3$, MgOFe$_2$O$_3$, EuO, Y$_3$Fe$_5$O$_{12}$ and/or a combination thereof) and may further include an anti-ferromagnetic layer and/or a synthetic anti-ferromagnetic layer to fix the magnetization direction. The anti-ferromagnetic layer may include an anti-ferromagnetic material (for example, PtMn, IrMn, MnO, MnS, MnTe, MnF$_2$, FeC$_{l2}$, FeO, CoC$_{l2}$, CoO, NiC$_{l2}$, NiO, Cr, and/or a combination thereof). The synthetic anti-ferromagnetic layer may include Cu, Ru, Ir, and/or a combination thereof.

Figure 5A:
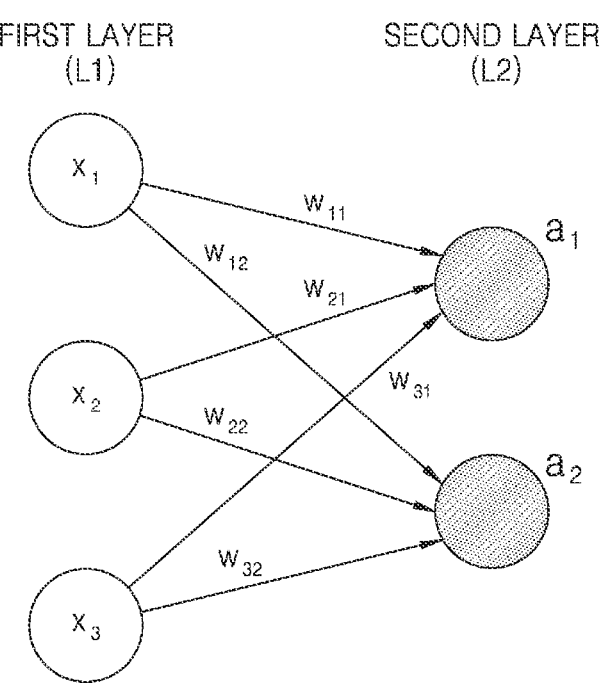
FIG. 5A illustrates an example of a neural network.
Figure 5B:
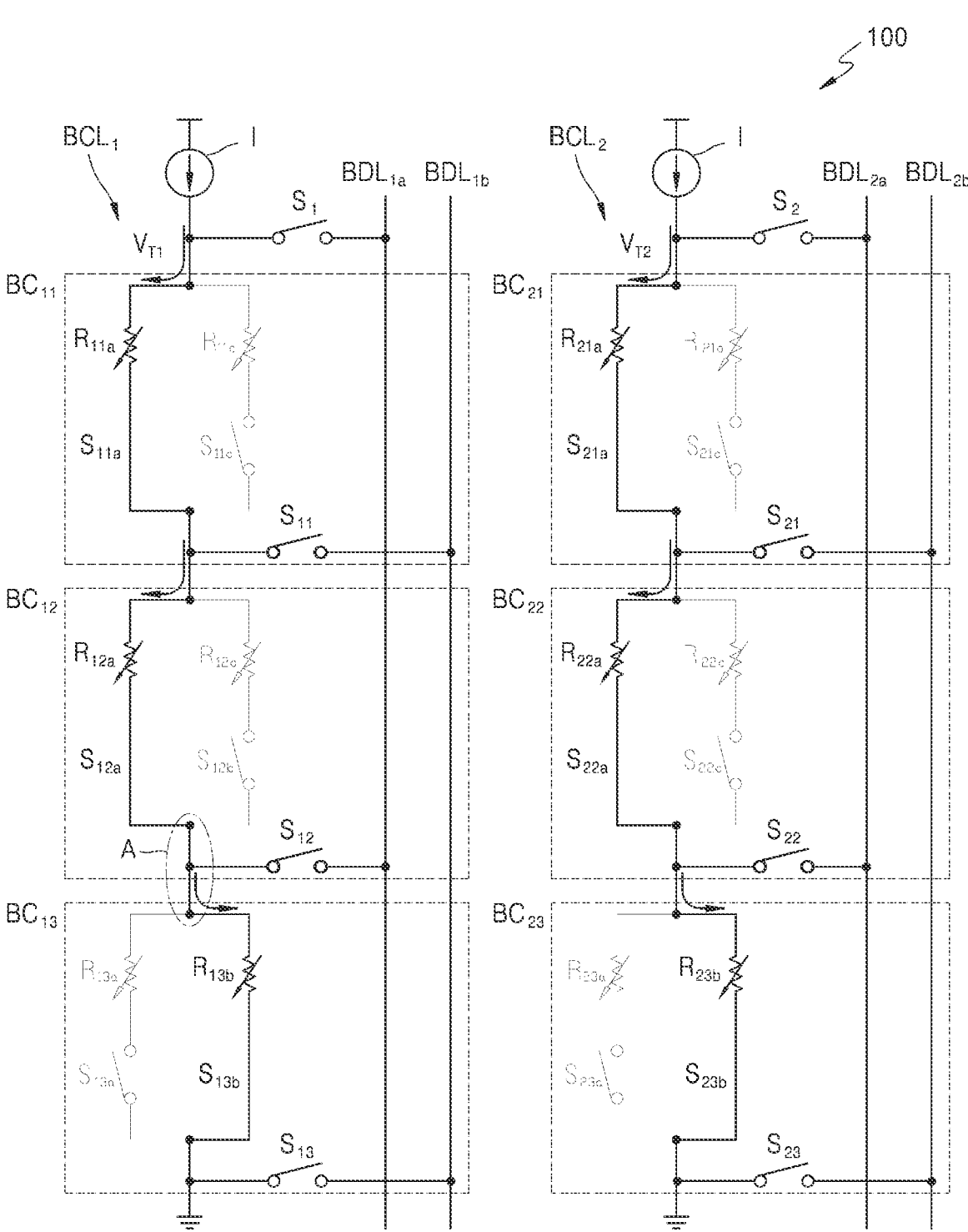
FIG. 5B illustrates an example of a circuit diagram of a processing device configured to perform an operation of a neural network.

FIG. 5A illustrates an example of a neural network (e.g., a neural network including a first layer having three nodes and a second layer having two nodes). FIG. 5B illustrates an example of a circuit diagram of a processing device (e.g., a processing device 100 implemented using a bitcell (e.g., the bitcell BC of FIG. 3)) configured to perform an operation of a neural network (e.g., configured to perform an operation of the second layer of the neural network of FIG. 5A).

Referring to FIG. 5A, in a first node a$_1$ of a second layer L2 (as in Equation 2 below, for example), a MAC operation of performing three multiplications of multiplying inputs x$_1$, x$_2$, and x$_3$ provided by the nodes of a first layer L1 respectively by weights w$_{11}$, w$_{21}$, and w$_{31}$ and summation of multiplication result values may be performed. In a second node a$_2$ of the second layer L2 (as in Equation 3 below, for example), a MAC operation of performing three multiplications of multiplying the inputs x$_1$, x$_2$, and x$_3$ provided by the nodes of the first layer L1 by weights w$_{12}$, w$_{22}$, and w$_{32}$ and summation of multiplication result values may be performed.

$$a_1 = x_1 \cdot w_{11} + x_2 \cdot w_{21} + x_3 \cdot w_{31} \qquad \text{Equation 2:}$$

$$a_2 = x_1 \cdot w_{12} + x_2 \cdot w_{22} + x_3 \cdot w_{32} \qquad \text{Equation 3:}$$

The processing device 100 of FIG. 5B may include several bitcells BC of FIG. 3 configured to perform an operation of the second layer L2 of FIG. 5A.

The processing device 100 of FIG. 5B includes a first bitcell line $BCL_1$ including three bitcells $BC_{11}$, $BC_{12}$, and $BC_{13}$ serially connected to one another, and a second bitcell line $BCL_2$ including three bitcells $BC_{21}$, $BC_{22}$, and $BC_{23}$ serially connected to one another. In the first bitcell line $BCL_1$, an operation of Equation 2 of the first node $a_1$ of FIG. 5A may be performed. In the second bitcell line $BCL_2$, an operation of Equation 3 of the second node $a_2$ of FIG. 5A may be performed.

As a current I of a certain value is applied to each of the bitcell lines $BCL_1$ and $BCL_2$, a sum of products of weights and inputs respectively applied to the bitcells $BC_{11}$, $BC_{12}$, $BC_{13}$, $BC_{21}$, $BC_{22}$, and $BC_{23}$ may be derived from a sum of voltage drops respectively occurring in the bitcells $BC_{11}$, $BC_{12}$, $BC_{13}$, $BC_{21}$, $BC_{22}$, and $BC_{23}$. Inputs and weights will be described below by illustrating a case such as Table 2 below, for example.

TABLE 2

| Input | Weight (first node $a_1$) | Weight (second node $a_2$) |
|---|---|---|
| $x_1 = 1$ | $w_{11} = 1$ | $w_{12} = -1$ |
| $x_2 = 1$ | $w_{21} = -1$ | $w_{22} = -1$ |
| $x_3 = -1$ | $w_{31} = -1$ | $w_{32} = 1$ |

The resistance values of variable resistors $R_{11a}$, $R_{11b}$, $R_{12a}$, $R_{12b}$, ..., $R_{23a}$, and $R_{23b}$ included in the processing device 100 may be set by the weights of Table 2, as in Table 3 below, for example. Opening and closing states of switches $S_{11a}$, $S_{11b}$, $S_{12a}$, $S_{12b}$, ..., $S_{23a}$, and $S_{23b}$ serially connected to the variable resistors $R_{11a}$, ..., and $R_{23b}$ may be set by the inputs of Table 2, as in Table 4 below, for example.

TABLE 3

| First bitcell line $BCL_1$ ($\Omega$) | | Second bitcell line $BCL_2$ ($\Omega$) | |
|---|---|---|---|
| $R_{11a} = 20$ | $R_{11b} = 5$ | $R_{21a} = 5$ | $R_{21b} = 20$ |
| $R_{12a} = 5$ | $R_{12b} = 20$ | $R_{22a} = 5$ | $R_{22b} = 20$ |
| $R_{13a} = 5$ | $R_{13b} = 20$ | $R_{23a} = 20$ | $R_{23b} = 5$ |

TABLE 4

| First bitcell line $BCL_1$ | | Second bitcell line $BCL_2$ | |
|---|---|---|---|
| $S_{11a}$ = Close | $S_{11b}$ = Open | $S_{21a}$ = Close | $S_{21b}$ = Open |
| $S_{12a}$ = Close | $S_{12b}$ = Open | $S_{22a}$ = Close | $S_{22b}$ = Open |
| $S_{13a}$ = Open | $S_{13b}$ = Close | $S_{23a}$ = Open | $S_{23b}$ = Close |

When a current of 1 A is provided to the first and second bitcell lines $BCL_1$ and $BCL_2$ set as in Table 3 and Table 4, a voltage drop may occur while the current is flowing toward a variable resistor for which a switch is closed from among the variable resistors included in each bitcell. At this time, when voltages (e.g., $V_{T1}$ and $V_{T2}$) are measured from upper ends of the first and second bitcell lines $BCL_1$ and $BCL_2$, the measured voltages may correspond to sums of the voltage drops occurring in the bitcells. Voltage drops occurring in the bitcells $BC_{11}$, $BC_{12}$, and $BC_{13}$ included in the first bitcell line $BCL_1$ may be expressed as in Table 5 below, for example, and voltage drops occurring in the bitcells $BC_{21}$, $BC_{22}$, and $BC_{23}$ included in the second bitcell line $BCL_2$ may be expressed as in Table 6 below, for example.

TABLE 5

| | Input | Weight | Input * Weight | Resistance ($\Omega$) | Current (A) | Voltage (V) |
|---|---|---|---|---|---|---|
| First bitcell $BC_{11}$ | 1 | 1 | 1 | 20 | 1 | 20 |
| Second bitcell $BC_{12}$ | 1 | -1 | -1 | 5 | 1 | 5 |
| Third bitcell $BC_{13}$ | -1 | -1 | 1 | 20 | 1 | 20 |
| First bitcell line $BCL_1$ | n/a | n/a | n/a | 45 | 1 | 45 |

TABLE 6

| | Input | Weight | Input * Weight | Resistance ($\Omega$) | Current (A) | Voltage (V) |
|---|---|---|---|---|---|---|
| First bitcell $BC_{21}$ | 1 | -1 | -1 | 5 | 1 | 5 |
| Second bitcell $BC_{22}$ | 1 | -1 | -1 | 5 | 1 | 5 |
| Third bitcell $BC_{23}$ | -1 | 1 | -1 | 5 | 1 | 5 |
| Second bitcell line $BCL_2$ | n/a | n/a | n/a | 15 | 1 | 15 |

A voltage drop of 45V in the first bitcell line $BCL_1$ and a voltage drop of 15V in the second bitcell line $BCL_2$ may represent MAC operation results of weights and inputs applied to the bitcells included in the bitcell lines $BCL_1$ and $BCL_2$, respectively. A relationship between a voltage drop and a MAC operation result may be illustrated as in Table 7 below, for example.

TABLE 7

| Voltage drop (V) | Sum of products of inputs and weights |
|---|---|
| 15 | -3 |
| 30 | -1 |
| 45 | 1 |
| 60 | 3 |

Referring to Table 7, a voltage drop in the first bitcell line $BCL_1$ was measured to be 45V, and thus, a sum of products of an input and a weight applied to the first bitcell line $BCL_1$ may be '1'. A voltage drop in the second bitcell line $BCL_2$ was measured to be 15V, and thus a sum of products of an input and a weight applied to the second bitcell line $BCL_2$ may be '−3'.

Although each of the bitcell lines $BCL_1$ and $BCL_2$ includes three bitcells in FIG. 5B, various numbers of bitcells equal to or greater than one or more bitcells may be included in a bitcell line. For example, a number of bitcells ranging from 64 to 256 may be included in a bitcell line. In an example, the processing device 100 may include 64 or more serially connected bitcells.

Although the processing device 100 of FIG. 5B includes only two bitcell lines, the processing device 100 may include various numbers of bitcell lines, namely, one or more bit lines. For example, the processing device 100 may include a number of bitcell lines ranging between 64 and 128. In an example, the bitcells of the processing device 100 may form a bitcell array including 64 or more bitcell lines.

A configuration of a plurality of bitcell lines each including a plurality of bitcells may be referred to as a bitcell array.

The processing device 100 of FIG. 5B may be an in-memory processing unit that stores values corresponding to weights in a memory device including variable resistors and performs an operation by using the stored values. In contrast with a Von Neumann structure where a memory and an operation part are separated, the in-memory processing unit may provide fast data transmission and reduced power consumption.

A processing device that applies a constant current I to serially-connected bitcells and derives an operation result corresponding to a sum of products from a voltage drop occurring in a bitcell line has been described above with reference to the embodiment of FIG. 5B. However, the structure of the bitcell BC of FIG. 3 is also applicable to different types of processing devices.

Figure 6:
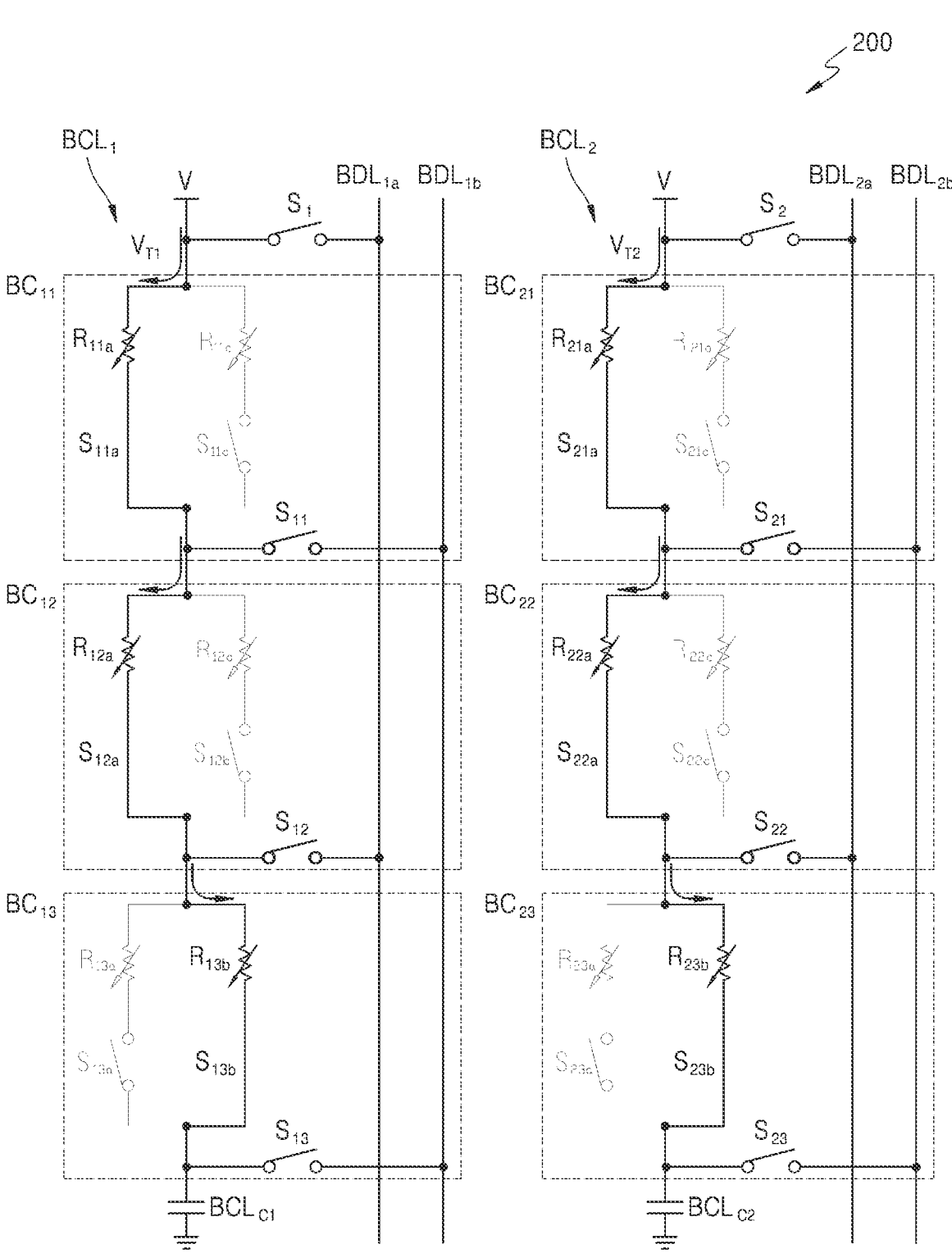
FIG. 6 illustrates an example of a circuit diagram of a processing device configured to perform an operation of a neural network.

FIG. 6 illustrates an example of a circuit diagram of a processing device (e.g., a processing device 200) configured to perform an operation of a neural network (e.g., the neural network of FIG. 5A). Referring to FIG. 6, in contrast with FIG. 5B, capacitors $BCL_{C1}$ and $BCL_{C2}$ may be provided on respective lower ends of the bitcell lines $BCL_1$ and $BCL_2$, and be serially connected to bitcells of the bitcell line $BCL_1$ and bitcells of the bitcell line $BCL_2$, respectively. In other words, according to an embodiment of FIG. 6, after a voltage V is applied to each of the bitcell lines $BCL_1$ and $BCL_2$, the processing device 200 may be implemented using a Time to Digital Converter (TDC) method which is a method of measuring a time period during which the voltage of each of the capacitors $BCL_{C1}$ and $BCL_{C2}$ rises to a specific value.

FIGS. 7 through 15 illustrate examples explaining layouts of a processing device (e.g., either of processing devices 100 or 200) implemented using the bitcell BC of FIG. 3. Examples of the structure of such processing device will be further described below with reference to FIGS. 7 through 15.

Figure 7:
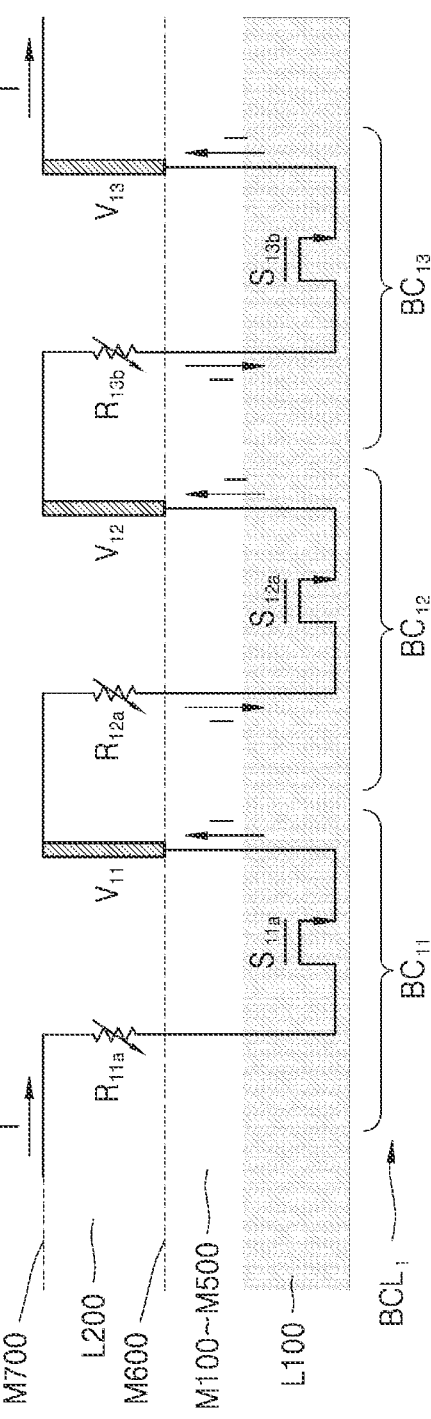
FIG. 7 illustrates an example of a connection relationship between a variable resistor and a switch.

FIG. 7 illustrates an example of a connection structure between variable resistors and switches in a bitcell included in a processing device. By taking the first bitcell line $BCL_1$ of FIG. 5B as an example, FIG. 7 illustrates a cross-sectional view of a processing device including an active layer, a variable resistor layer, and metal layers.

Referring to FIG. 7, an active layer L100 including the switches $S_{11a}$, $S_{12a}$, and $S_{13b}$ formed therein, first through sixth metal layers M100 through M600, and a variable resistor layer L200 may be sequentially stacked. A relationship between the positions of the active layer L100 and the variable resistor layer L200 may depend on a process sequence in which the active layer L100 is first formed and metal wires and the variable resistors $R_{11a}$, $R_{12a}$, $R_{13b}$, etc. are manufactured on the active layer L100.

The active layer L100 may be a layer including the switches $S_{11a}$, $S_{12a}$, $S_{13b}$, etc. of FIG. 5B formed therein, and thus may be a layer in which the switches $S_{11a}$, $S_{12a}$, $S_{13b}$, etc. are formed on a silicon wafer through a transistor formation process or the like. For convenience of explanation, the active layer L100 of FIG. 7 shows the switches $S_{11a}$, $S_{12a}$, and $S_{13b}$ existing on the path of the current I flowing in the first bitcell line $BCL_1$ due to the inputs and weights of Table 2 from among the switches $S_{11a}$, $S_{11b}$, $S_{12a}$, $S_{12b}$, $S_{13a}$, $S_{13b}$, $S_1$, $S_{11}$, $S_{12}$, and $S_{13}$ included in the first bitcell line $BCL_1$ of FIG. 5B. The remaining switches $S_{11b}$, $S_{12b}$, $S_{13a}$, $S_1$, Sn, $S_{12}$, and $S_{13}$ of FIG. 5B are in an open state, and thus the current I applied to the first bitcell line $BCL_1$ does not flow in the remaining switches $S_{11b}$, $S_{12b}$, $S_{13a}$, $S_1$, Sn, $S_{12}$, and $S_{13}$, and thus the remaining switches $S_{11b}$, $S_{12b}$, $S_{13a}$, $S_1$, $S_{11}$, $S_{12}$, and $S_{13}$ are not shown in FIG. 7. However, the remaining switches $S_{11b}$, $S_{12b}$, $S_{13a}$, $S_1$, $S_{11}$, $S_{12}$, and $S_{13}$ of FIG. 5B not shown in FIG. 7 may be formed in the active layer L100 and may be arranged on a horizontally different location from the switches $S_{11a}$, $S_{12a}$, and $S_{13b}$. In addition, the switches $S_{21a}$, $S_{21b}$, $S_{22a}$, $S_{22b}$, $S_{23a}$, $S_{23b}$, $S_2$, $S_{21}$, $S_{22}$, and $S_{23}$ included in the second bitcell line $BCL_2$ of FIG. 5B may be arranged similarly to the first bitcell line $BCL_1$.

The variable resistor layer L200 may be a layer including the variable resistors $R_{11a}$, $R_{12a}$, $R_{13b}$, etc. and vias $V_{11}$, $V_{12}$, and $V_{13}$ formed therein, a seventh metal layer M700 may be located above the variable resistor layer L200, and a sixth metal layer M600 may be located below the variable resistor layer L200.

The variable resistors $R_{11a}$, $R_{12a}$, $R_{13b}$, etc. may be formed in a vertical direction in the variable resistor layer L200 such that one end of both ends of each variable resistor is connected to the seventh metal layer M700 and the other end is connected to the sixth metal layer M600. Hereinafter, respective ends of the vertically-formed variable resistors $R_{11a}$, $R_{12a}$, $R_{13b}$, etc. on the side of the seventh metal layer M700 may be referred to as upper end portions of the variable resistors, and respective ends thereof on the side of the sixth metal layer M600 may be referred to as lower end portions of the variable resistors. A current flowing through the variable resistors $R_{11a}$, $R_{12a}$, $R_{13b}$, etc. may flow in a direction from the upper end portion of each variable resistor to the lower end portion thereof or from the lower end portion to the upper end portion.

The variable resistor layer L200 of FIG. 7 is illustrated as showing the variable resistors $R_{11a}$, $R_{12a}$, and $R_{13b}$ existing on the path of a current flowing due to the inputs and weights of Table 2 from among the variable resistors $R_{11a}$, $R_{11b}$, $R_{12a}$, $R_{12b}$, $R_{13a}$, and $R_{13b}$ included in the first bitcell line $BCL_1$ of FIG. 5B. However, although not shown in FIG. 7, the remaining variable resistors $R_{11b}$, $R_{12b}$, and $R_{13a}$ may also formed in the variable resistor layer L200 and may be arranged at a horizontally different location from the variable resistors $R_{11a}$, $R_{12a}$, and $R_{13b}$.

The vias $V_{11}$, $V_{12}$, and $V_{13}$ may penetrate through the variable resistor layer L200 and electrically connect the seventh metal layer M700 to the sixth metal layer M600. The variable resistors (e.g., $R_{11a}$, $R_{12a}$, and $R_{13b}$) existing on the path of a current flowing due to the inputs and weights of Table 2 from among the variable resistors of the bitcells may be serially connected to one another through the vias $V_{11}$, $V_{12}$, and $V_{13}$, and an example connection structure thereof will be further described later in more detail.

The first through seventh metal layers M100 through M700 may be layers on which conductive wires (such as wires for connecting the variable resistors $R_{11a}$, $R_{12a}$, $R_{13b}$, etc. to the switches $S_{11a}$, $S_{12a}$, $S_{13b}$, etc., and wires for transmitting an ON/OFF signal to the switches $S_{11a}$, $S_{12a}$, $S_{13b}$, etc.) are formed.

When describing the connection relationship between the switches $S_{11a}$, $S_{12a}$, and $S_{13b}$ and the variable resistors $R_{11a}$, $R_{12a}$, and $R_{13b}$, shown in FIG. 7, different variable resistors may be electrically connected to both ends of each of the switches $S_{11a}$ and $S_{12a}$. However, in an example, different variable resistors may not be electrically connected to both ends of the switch $S_{13b}$, as the switch $S_{13b}$ may be included in the third bitcell $BC_{13}$ arranged last in the first bitcell line $BCL_1$ (on the lowest end of the first bitcell line $BCL_1$) as shown in FIG. 5B.

When illustrating and describing the first switch $S_{12a}$ of the second bitcell $BC_{12}$, one end of the switch $S_{12a}$ is connected to the first variable resistor $R_{12a}$ of the second bitcell $BC_{12}$ and the other end of the switch $S_{12a}$ is connected to the second variable resistor $R_{13b}$ of the third bitcell $BC_{13}$. For example, one end of the switch $S_{12a}$ is connected to the lower end portion of the variable resistor $R_{12a}$, and the other end of the switch $S_{12a}$ is connected to the upper end portion of the variable resistor $R_{13b}$ through the via $V_{12}$. As described above, because the active layer L100 is located below the variable resistor layer L200, the via $V_{12}$ of the second bitcell $BC_{12}$ penetrating through the variable resistor layer L200 may be used to connect the switch $S_{12a}$ to the upper end portion of the variable resistor $R_{13b}$. Referring to FIG. 5B, a location where the switch $S_{12a}$ is connected to the upper end portion of the variable resistor $R_{13b}$ via the via $V_{12}$ of the second bitcell $BC_{12}$ may be an 'A' region which is a connection between the second bitcell $BC_{12}$ and the third bitcell $BC_{13}$. In other words, the via $V_{12}$ may be used to connect any switch of the second bitcell $BC_{12}$ to any variable resistor of the third bitcell $BC_{13}$. Similarly, the via $V_{11}$ of the first bitcell $BC_1$ may electrically connect any switch of the first bitcell $BC_1$ to any variable resistor of the second bitcell $BC_{12}$. In other words, due to such a structure of vias, all of the variable resistors of each bitcell may be serially connected to one another.

Figure 8:
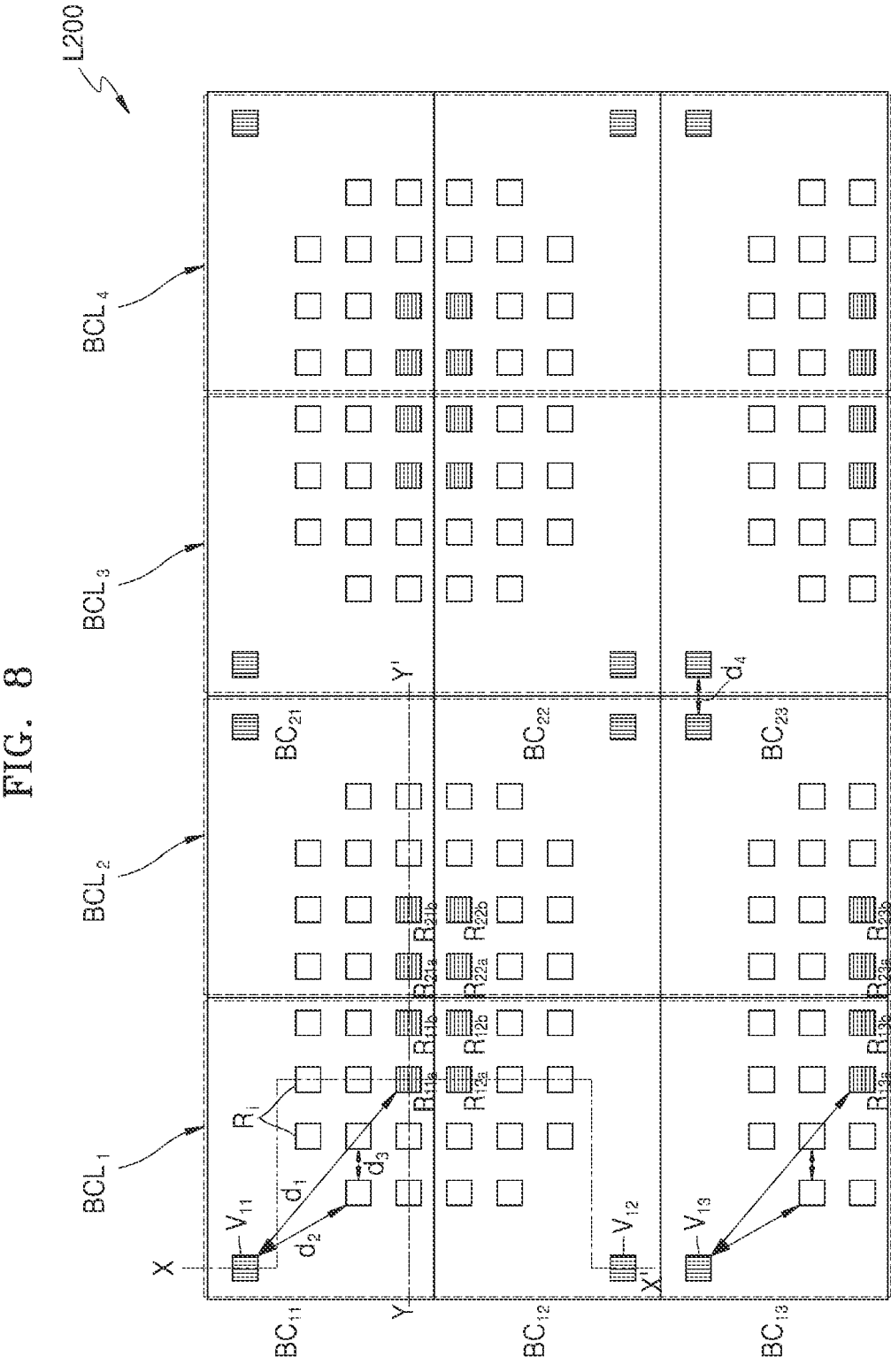
FIG. 8 illustrates an example of a horizontally cross-sectional view illustrating a variable resistor layer.

FIG. 8 illustrates an example of a horizontally cross-sectional view illustrating a variable resistor layer (e.g., the variable resistor layer L200 of FIG. 7).

Referring to FIG. 8, the variable resistor layer L200 may include four bitcell lines each including three bitcells. FIG. 5B illustrates the first and second bitcell lines $BCL_1$ and $BCL_2$. Compared with FIG. 5B, FIG. 8 illustrates four bitcell lines further including third and fourth bitcell lines $BCL_3$ and $BCL_4$ in addition to the first and second bitcell lines $BCL_1$ and $BCL_2$ in order to show a configuration of variable resistors and vias. Because the first bitcell line $BCL_1$ and the third bitcell line $BCL_3$ have the same structures and the second bitcell line $BCL_2$ and the fourth bitcell line $BCL_4$ have the same structures, the variable resistors and the vias of the third and fourth bitcell lines $BCL_3$ and $BCL_4$ are not indicated by reference numerals.

Referring to FIG. 8, each bitcell may further include an inactive variable resistor in addition to variable resistors and a via. For example, the first bitcell $BC_1$ of the first bitcell line $BCL_1$ may further include nine inactive variable resistors $R_i$ in addition to the variable resistors $R_{11a}$ and $R_{11b}$ and the via $V_{11}$ of FIG. 5B.

The inactive variable resistors $R_i$ may be variable resistors not used in processing in contrast with the above-described variable resistors $R_{11a}$ and $R_{11b}$, and may not be electrically connected to the switches $S_{11a}$, $S_{11b}$, etc. of FIG. 5B. The variable resistors $R_{11a}$, $R_{11b}$, etc. used in processing may be referred to as active variable resistors to be distinguished from the inactive variable resistors $R_i$. The inactive variable resistors $R_i$ may be formed to obtain the active variable resistors $R_{11a}$, $R_{11b}$, etc. having uniform electrical characteristics. For example, due to a manufacturing process of the variable resistor layer L200 and/or the processing device, the variable resistors formed to be surrounded by other variable resistors (e.g., near a center of an array of the variable resistors) may exhibit relatively uniform electrical characteristics compared with the variable resistors formed on an edge of the array, and thus only the variable resistors having good reliability (e.g., due to the relatively uniform electrical characteristics) and being located on the center may be used in processing, and the remaining variable resistors may be inactive variable resistor which are not used in processing.

Examples of the variable resistors included in the four bitcells $BC_{11}$, $BC_{12}$, $BC_{21}$, and $BC_{22}$ of FIG. 8 will now be illustrated and described. Eleven variable resistors may be formed in each bitcell, and the four bitcells $BC_{11}$, $BC_{12}$, $BC_{21}$, and $BC_{22}$ may include a total of 44 variable resistors formed therein. Active variable resistors may be located at the center of a group of bitcells (e.g., the four bitcells $BC_{11}$, $BC_{12}$, $BC_{21}$, and $BC_{22}$) and thus may be surrounded by other variable resistors. In other words, in the four bitcells $BC_{11}$, $BC_{12}$, $BC_{21}$, and $BC_{22}$, the eight variable resistors $R_{11a}$, $R_{11b}$, $R_{12a}$, $R_{12b}$, $R_{21a}$, $R_{21b}$, $R_{22a}$, and $R_{22b}$ surrounded by 36 inactive variable resistors $R_i$ may correspond to eight active variable resistors.

Referring to FIG. 8, each of the vias $V_1$ and $V_{12}$ may be formed in the variable resistor layer L200 to have a structure of penetrating through the variable resistor layer L200, and the vias $V_1$ or $V_{12}$ may be used to connect a switch of a bitcell including the vias $V_{11}$ or $V_{12}$ to the upper end portion of any variable resistor of a bitcell adjacent the bitcell. The vias $V_{11}$, $V_{12}$, etc. may be arranged to be sufficiently spaced apart (e.g., spaced apart by a predetermined distance) from variable resistors. For example, in the first bitcell $BC_1$ of the first bitcell line $BCL_1$ of FIG. 8, the active and inactive variable resistors $R_{11a}$, $R_{11b}$, and $R_i$ may be arranged near the right lower corner, and the via $V_{11}$ may be arranged near the left upper corner which is sufficiently spaced apart from the variable resistors $R_{11a}$, $R_{11b}$, and $R_i$. A distance $d_1$ may be a minimum distance between the via of a bitcell and the active variable resistors of the bitcell (e.g., the distance $d_1$ may be a minimum distance between the via $V_{11}$ of the first bitcell $BC_1$ and the active variable resistors $R_{11a}$ and $R_{11b}$ of the first bitcell $BC_{11}$, and may be a minimum distance between the via $V_{12}$ of the second bitcell $BC_{12}$ and the active variable resistors $R_{12a}$ and $R_{12b}$ of the second bitcell $BC_{12}$), and a distance $d_2$ may be a minimum distance between the via of the bitcell and the inactive variable resistors of the bitcell.

According to the above-described configuration of FIG. 8, the minimum distance $d_1$ between the via $V_{11}$, $V_{12}$, etc. and the active variable resistors $R_{11a}$, $R_{11b}$, $R_{12a}$, $R_{12b}$, etc. of a bitcell (e.g., the minimum distance between the via $V_{11}$ and the active variable resistors $R_{11a}$, $R_{11b}$, etc of the bitcell $BC_1$ or the minimum distance between the via $V_{12}$ and the active variable resistors $R_{12a}$, $R_{12b}$, etc of the bitcell $BC_{12}$) may be greater than the minimum distance $d_2$ between the via $V_1$, $V_{12}$, etc. and the inactive variable resistors $R_i$ of the bitcell (e.g., the minimum distance between the via $V_1$ and the inactive variable resistors $R_i$ of the bitcell $BC_1$ or the minimum distance between the via $V_{12}$ and the inactive variable resistors $R_i$ of the bitcell $BC_{12}$). The minimum distance $d_1$ between the via $V_{11}$, $V_{12}$, etc. and the active variable resistors $R_{11a}$, $R_{11b}$, $R_{12a}$, $R_{12b}$, etc. may be, for example, 0.50 μm to 1.20 μm, and the minimum distance $d_2$ between the vias $V_{11}$, $V_{12}$, etc. and the inactive variable resistors $R_i$ may be, for example, 0.30 μm to 0.60 μm.

A minimum distance $d_3$ between variable resistors of a bitcell (e.g., a distance any of the variable resistors $R_{11a}$, $R_{11b}$, $R_{12a}$, $R_{12b}$, and $R_i$ and a closest variable resistor) may be less than the minimum distance $d_1$ between the via $V_{11}$, $V_{12}$, etc. of the bitcell and the active variable resistors $R_{11a}$, $R_{11b}$, $R_{12a}$, $R_{12b}$, etc. of the bitcell or the minimum distance $d_2$ between the via $V_1$, $V_{12}$, etc. of the bitcell and the inactive variable resistors $R_i$. of the bitcell, and may be, for example, 0.10 μm to 0.40 μm. A minimum distance $d_4$ between a via $V_{11}$, $V_{12}$, etc. of a bitcell and a closest adjacent via of an adjacent bitcell may be less than the minimum distance $d_1$ between the via $V_{11}$, $V_{12}$, etc. of the bitcell and the active variable resistors $R_{11a}$, $R_{11b}$, $R_{12a}$, $R_{12b}$, etc. of the bitcell and the minimum distance $d_2$ between the via $V_{11}$, $V_{12}$, etc. of the bitcell and the inactive variable resistors $R_i$ of the bitcell, and may be, for example, 0.10 μm to 0.40 μm.

Respective configurations of variable resistors and/or vias in neighboring (or adjacent) bitcells may be vertically and/or bilaterally symmetrical to each other about a boundary line between the neighboring (or adjacent) bitcells. For example, a configuration of the variable resistors $R_{11a}$, $R_{11b}$, and $R_i$ and the via $V_{11}$ included in the first bitcell $BC_1$ may be vertically symmetrical to that of the variable resistors $R_{12a}$, $R_{12b}$, and $R_i$ and the via $V_{12}$ included in the second bitcell $BC_{12}$, based on a boundary line between the bitcells $BC_1$ and $BC_{12}$ adjacent to each other. Similarly, the configuration of the variable resistors $R_{11a}$, $R_{11b}$, and $R_i$ and the via $V_{11}$ included in the first bitcell $BC_1$ of the first bitcell line $BCL_1$ may be bilaterally symmetrical to a configuration of the variable resistors $R_{21a}$, $R_{21b}$, and $R_i$ and a via included in the first bitcell $BC_{21}$ of the second bitcell line $BCL_2$, based on a boundary line between the bitcells $BC_{11}$ and $BC_{21}$ adjacent to each other.

Figure 9A:
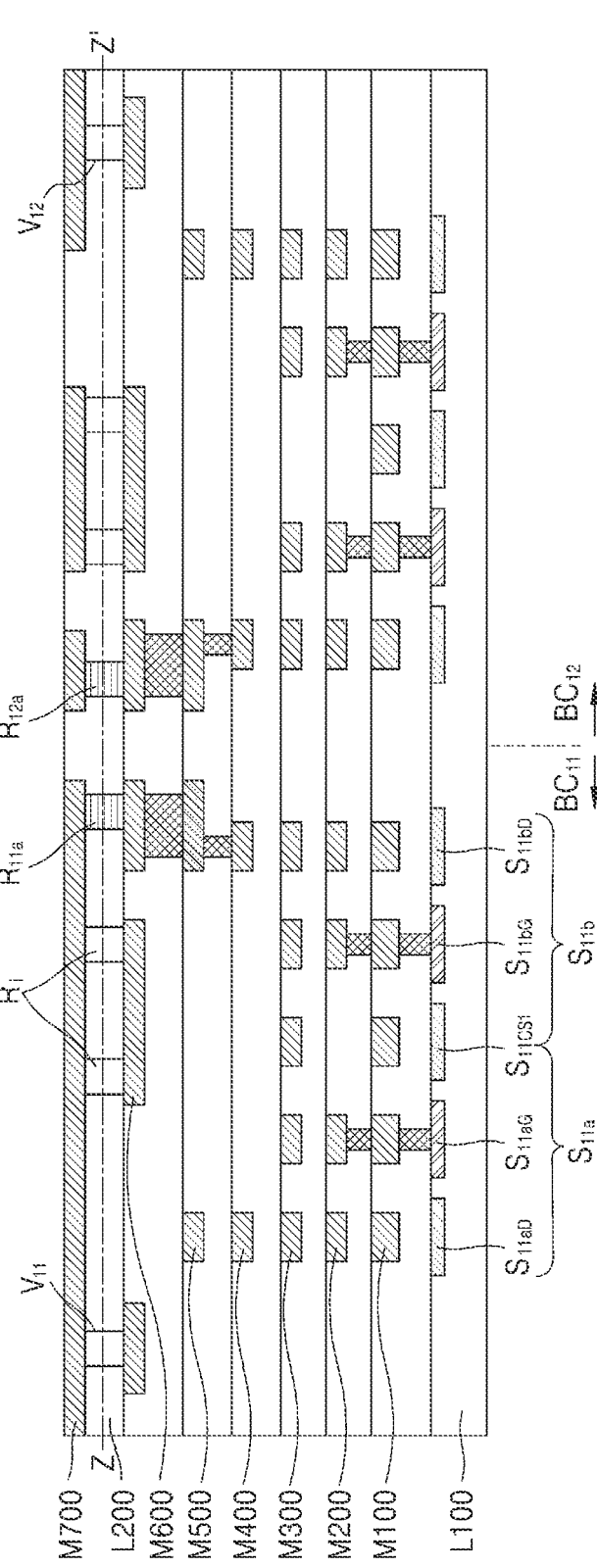
FIG. 9A illustrates an example of a vertical cross-sectional view of bitcells.
Figure 9B:
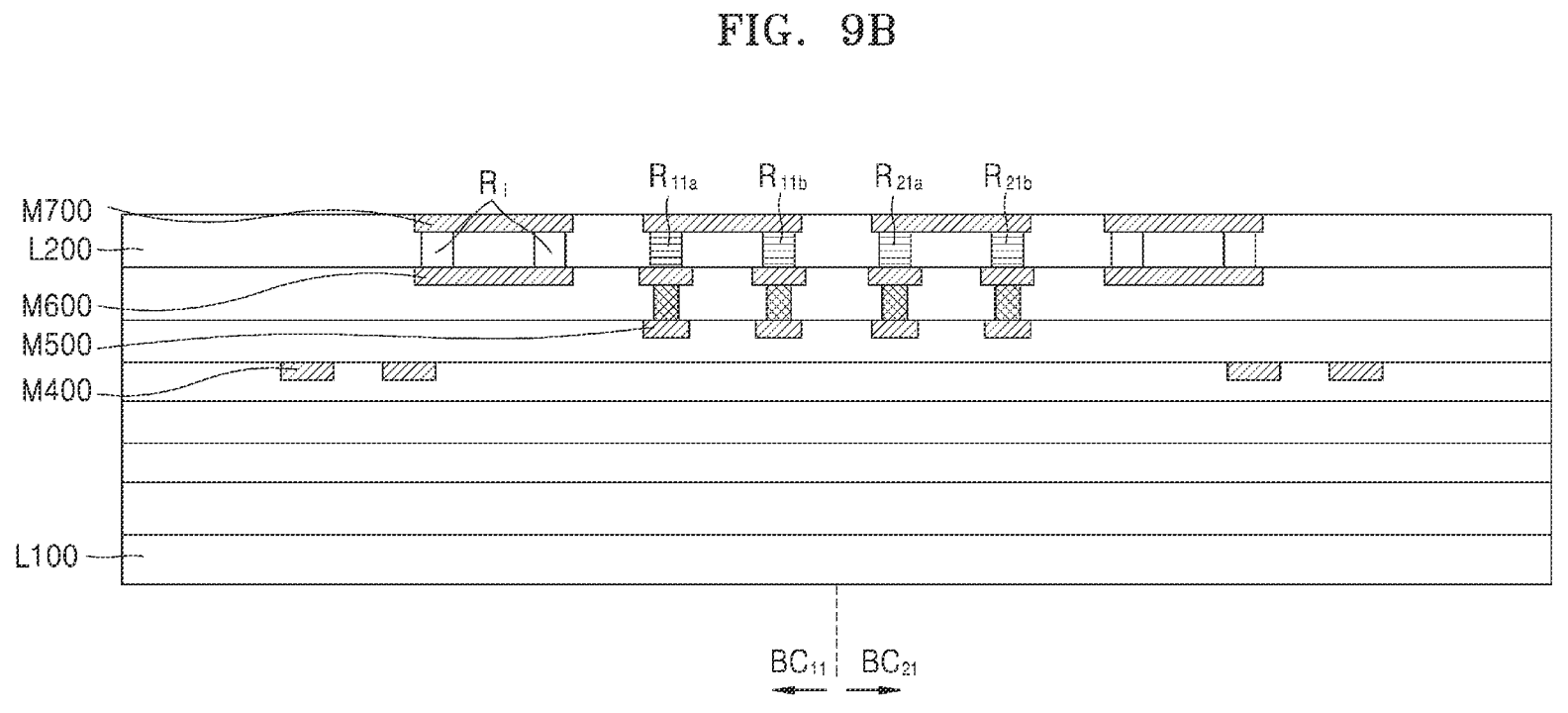

FIG. 9A illustrates an example of a vertical cross-sectional view of bitcells (e.g., a vertical cross-sectional view of the bitcells $BC_{11}$ and $BC_{12}$ taken along line X-X' of FIG. 8), and FIG. 9B illustrates an example of a vertical cross-sectional view of bitcells (e.g., a vertical cross-sectional view of the bitcells $BC_{11}$ and $BC_{21}$ taken along line Y-Y' of FIG. 8).

Referring to FIGS. 9A and 9B, the processing device 100 may include an active layer L100 in which a plurality of switches $S_{11a}$, $S_{11b}$, etc. are formed, a variable resistor layer L200 in which variable resistors $R_{11a}$, $R_{11b}$, etc. and vias $V_{11}$, $V_{12}$, etc. are formed, and a plurality of metal layers M100, M200, M300, M400, M500, M600, and M700.

The active layer L100 is a layer in which the switches (for example, $S_{11a}$, $S_{11b}$, etc. of FIG. 5B) included in bitcells (for example, $BC_{11}$, $BC_{12}$, $BC_{21}$, and $BC_{22}$ of FIG. 5B) are formed. Although FIG. 9A illustrates some switches such as switches $S_{11a}$ and $S_{11b}$ in the cross-section taken along line X-X', other not-shown switches may be formed in the active layer L100. The active layer L100 may be a silicon-based semiconductor layer. A detailed structure of the switches $S_{11a}$, $S_{11b}$, etc. will be further described later with reference to FIG. 10.

The plurality of metal layers M100, M200, M300, M400, M500, M600, and M700 may include wires for connecting the active variable resistors $R_{11a}$, $R_{11b}$, etc. to the switches $S_{11a}$, $S_{11b}$, etc., wires for transmitting an ON/OFF signal to the switches $S_{11a}$, $S_{11b}$, etc., and bit-data lines. For example, a lower end portion of the active variable resistor $R_{11a}$ may be connected to a drain $S_{11aD}$ of the switch $S_{11a}$, through vias that connect the metal layers M100, M200, M300, M400, M500, and M600 to one another. Although a path along which the active variable resistor $R_{11a}$ is connected to the drain $S_{11aD}$ is not shown in both FIGS. 9A and 9B, the path may be provided through various designs. For example, the third metal layer M300 may include wires for transmitting an ON/OFF signal to the switches $S_{11a}$, $S_{11b}$, etc., and the fourth metal layer M400 may include the bit-data lines $BDL_{1a}$, $BDL_{1b}$, $BDL_{2a}$ and $BDL_{2b}$ of FIGS. 5B and/or 6. The seventh metal layer M700 may include, for example, wires for respectively connecting the vias $V_{11}$ and $V_{12}$ (e.g., upper end portions of the vias $V_{11}$ and $V_{12}$), to the upper end portions of the active variable resistors $R_{12a}$ and $R_{13b}$.

Figure 10:
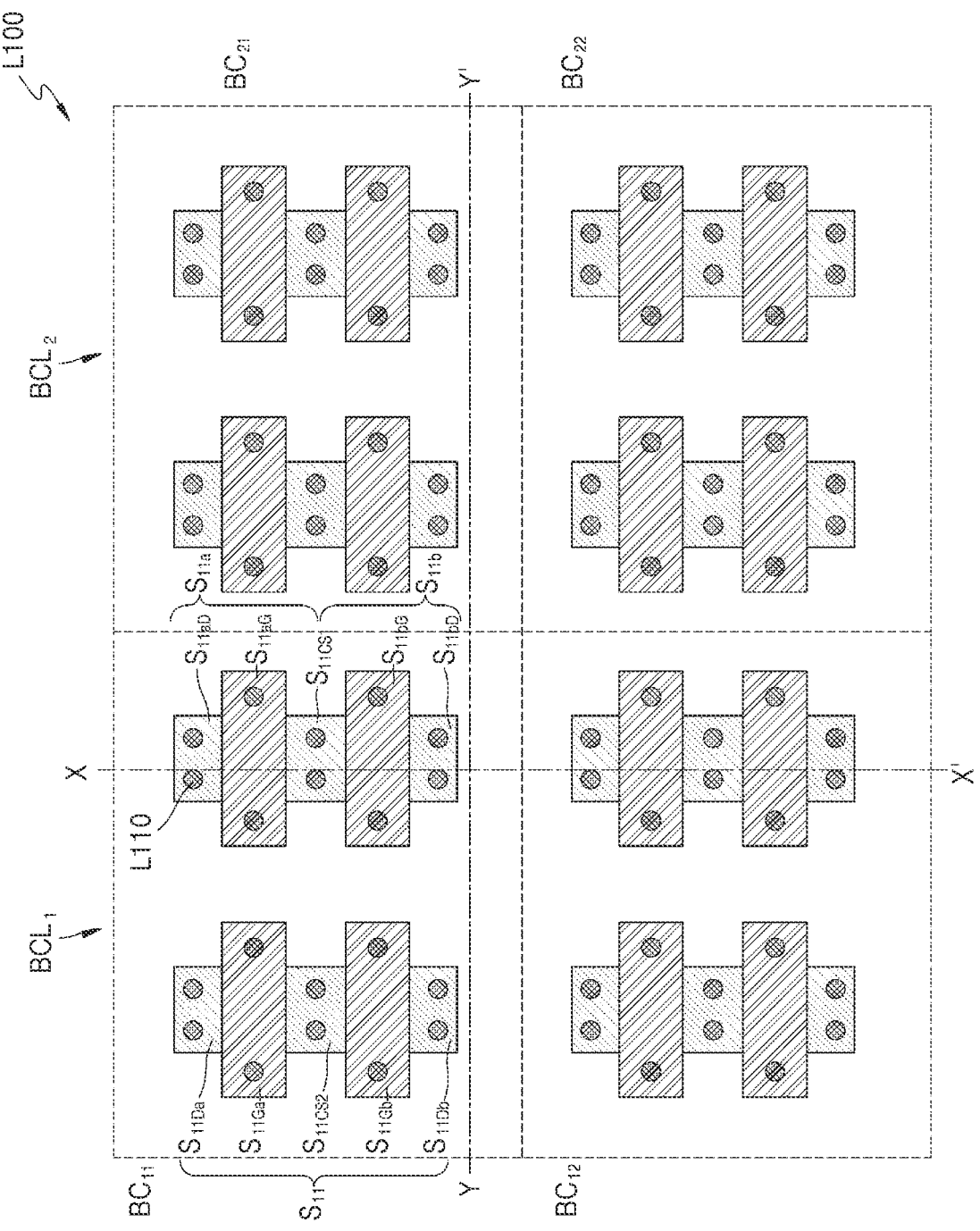
FIG. 10 illustrates an example of a plan view of an active layer of a processing device.

FIG. 10 illustrates an example of a plan view of an active layer (e.g., the active layer L100 of FIG. 9A).

FIG. 10 illustrates an example of the switches $S_{11a}$, $S_{11b}$, $S_{11}$, etc. included in the bitcells $BC_{11}$, $BC_{12}$, $BC_{21}$, and $BC_{22}$ of FIG. 5B. An example structure of the active layer L100 will now be described in detail with respect to the example of FIG. 10 showing the three switches $S_{11a}$, $S_{11b}$, and $S_{11}$ included in the first bitcell $BC_{11}$ of the first bitcell line $BCL_1$.

The switches $S_{11a}$, $S_{11b}$, and $S_{11}$ included in the active layer L100 may be Metal Oxide Semiconductor Field Effect Transistors (MOSFETs) each including a source, a drain, and a gate. A switch implemented by a MOSFET may operate in such a way that, when a gate voltage (equal to or greater than a threshold voltage) is applied to a gate, the switch may be turned on and thus a source and a drain may be electrically connected to each other, and, when no gate voltages are applied to the gate, the switch may be turned off and thus the source and the drain may be electrically disconnected from each other. For example, when a gate voltage is applied to a gate $S_{11aG}$ of the first switch $S_{11a}$, the first switch $S_{11a}$ may be turned on and thus a source $S_{11CS1}$ of the first switch $S_{11a}$ may be electrically connected to a drain $S_{11aD}$ of the first switch $S_{11a}$. For example, when a gate voltage is applied to a gate $S_{11bG}$ of the second switch $S_{11b}$, the second switch $S_{11b}$ may be turned on and thus a source $S_{11CS1}$ of the second switch $S_{11b}$ may be electrically connected to a drain $S_{11bD}$ of the second switch $S_{11b}$. In FIG. 10, the first switch $S_{11a}$ and the second switch $S_{11b}$ may be implemented to have a structure of commonly sharing the source $S_{11CS1}$. The bit-data line switch $S_{11}$ may have a structure including two gates $S_{11Ga}$ and $S_{11Gb}$, two drains $S_{11Da}$ and $S_{11Db}$, and a common source $S_{11CS2}$. The bit-data line switch $S_{11}$ may operate as a single transistor by using two transistors that receive the same signal. The switches $S_{11a}$, $S_{11b}$, $S_{11}$, etc. of the active layer L100 may be connected to the first metal layer M100 in marked regions L110. In an embodiment, the switches (e.g., $S_{11a}$, $S_{11b}$, and $S_{11}$) of the bitcell (e.g., the bitcells $BC_{11}$) may control either one of a voltage to be applied between two ends of each of the active variable resistors (e.g., $R_{11a}$ and $R_{11b}$) and a current flowing to each of the active variable resistors.

Figure 11:
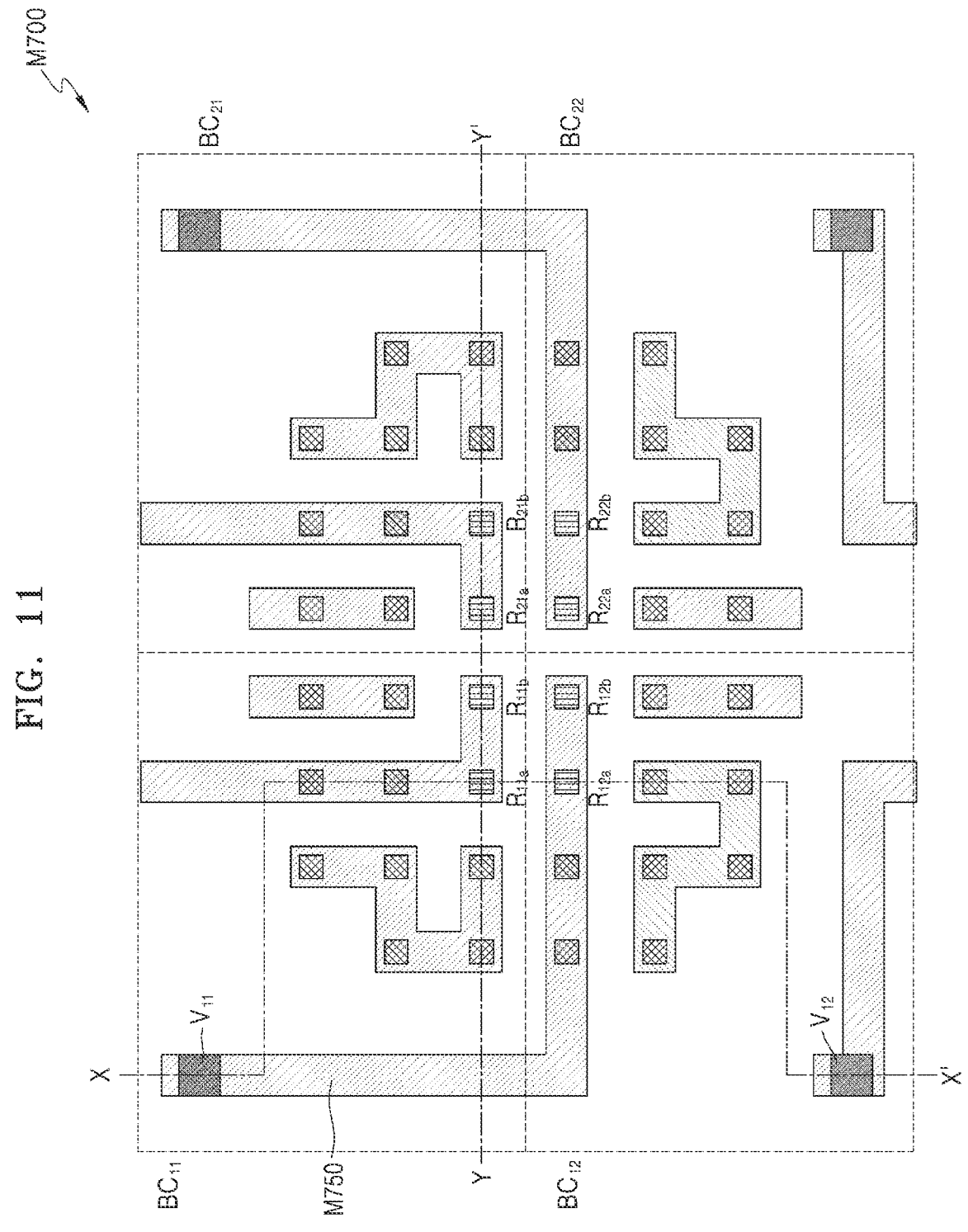
FIG. 11 illustrates an example of a plan view of a seventh metal layer of a processing device.

FIG. 11 illustrates an example of a plan view of a seventh metal layer of a processing device (e.g., the seventh metal layer M700 of FIG. 9A).

Referring to FIG. 11, the seventh metal layer M700 may be stacked above the variable resistor layer L200 and may provide wires for connecting the vias $V_{11}$, $V_{12}$, etc. to the upper end portions of the active variable resistors $R_{12a}$, $R_{13b}$, etc. For example, the via $V_{11}$ of the first bitcell $BC_{11}$ may be connected to the upper end portions of the active variable resistors $R_{12a}$ and $R_{12b}$ of the second bitcell $BC_{12}$ through a wire M750 of the seventh metal layer M700.

Referring to FIG. 11 together with FIG. 7, in an example, the current I flowing from respective upper end portions of the active variable resistors $R_{11a}$ and $R_{11b}$ of the first bitcell $BC_{11}$ to respective lower end portions thereof may flow down to the active layer L100 through the metal layers M100 through M600 and may respectively pass through the switches $S_{11a}$ and $S_{11b}$. Then, the current I may again flow to the upper end portion of each of the active variable resistors $R_{12a}$ and $R_{12b}$ of the second bitcell $BC_{12}$ through the metal layers M100 through M600 and the via $V_{11}$ and then through the wire M750 of the seventh metal layer M700.

The metal layers M100, M200, M500, and M600 may provide wires used for electrical connection between the above-described components. An insulation layer may be arranged between the metal layers M100 through M600.

In the above-described example embodiments, a structure in which the variable resistor layer L200 includes one via $V_{11}$, or $V_{12}$, or the like for one bitcell has been illustrated and described.

However, the number of vias included in a bitcell line may be greater than or smaller than the number of bitcells. For example, one via may be included in every two neighboring (or adjacent) bitcells within any bitcell line of the structure.

Figure 12:
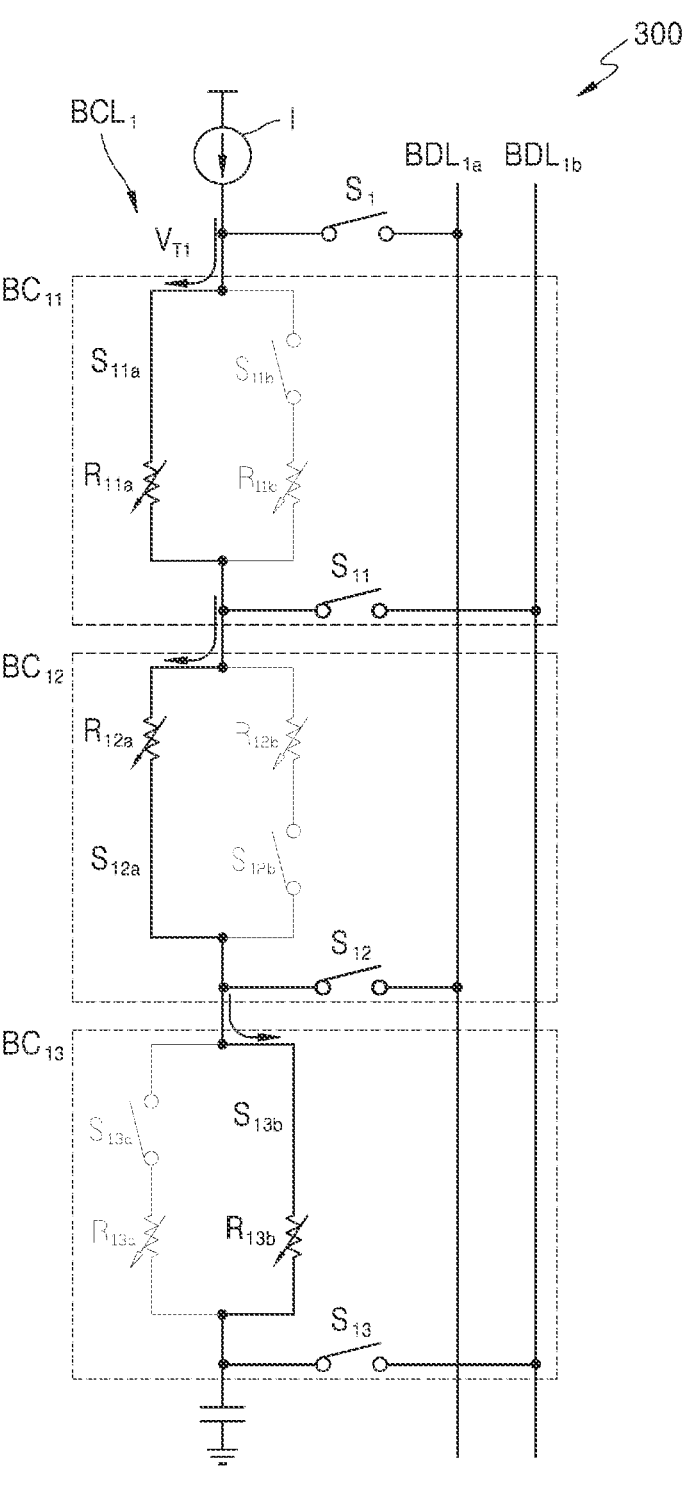
FIG. 12 illustrates an example of a circuit diagram of a processing device having a connection structure of a switch and a variable resistor that is different from that of another processing device.

FIG. 12 illustrates an example of a circuit diagram of a processing device (e.g., a processing device 300) having a connection structure of a switch and a variable resistor that is different from that of another processing device (e.g., including a bitcell having a different structure from that of FIG. 5B).

Referring to FIG. 12, the processing device 300 includes bitcells $BC_{11}$ and $BC_{13}$ each having a structure in which the current I flowing in the bitcell line $BCL_1$ flows through a switch (for example, $S_{11a}$ or $S_{13b}$) prior to flowing through a variable resistor (for example, $R_{11a}$ or $R_{13b}$, respectively).

When the structure of the first bitcell $BC_{11}$ of FIG. 12 is compared with the first bitcell $BC_{11}$ of FIG. 5B, the current I flowing in the first bitcell $BC_{11}$ of FIG. 5B flows to the variable resistor Ria, whereas the current I flowing in the first bitcell $BC_{11}$ of FIG. 12 flows to the first variable resistor $R_{11a}$ through the first switch $S_{11a}$. In other words, in the structure of the first bitcell $BC_{11}$ of FIG. 12 and the structure of the first bitcell $BC_{11}$ of FIG. 5B, the locations of the switches $S_{11a}$ and $S_1$b are opposite to those of the variable resistors $R_{11a}$ and $R_{11b}$, based on the direction of the current I.

In the processing device 300, a bitcell in which locations of the switches $S_{11a}$ and $S_{11b}$ and the variable resistors $R_{11a}$ and $R_{11b}$ are reversed like the first bitcell $BC_{11}$ of FIG. 12 may alternate with a bitcell in which the locations of the switches $S_{12a}$ and $S_{12b}$ and the variable resistors $R_{12a}$ and $R_{12b}$ are not reversed like the second bitcell $BC_{12}$ of FIG. 5B. In other words, in the processing device 300, a second bitcell $BC_{12}$ in which the locations of switches and variable resistors are not reversed may be arranged between the first and third bitcells $BC_{11}$ and $BC_{13}$ in which locations of switches and variable resistors are reversed.

According to the circuit structure of the processing device 300 of FIG. 12, the current I may also flow in the bitcell line $BCL_1$ without passing through a via formed in the variable resistor layer L200 like the vias $V_{11}$, $V_{12}$, etc. of the variable resistor layer L200. A connection relationship between a variable resistor and a switch related to the processing device 300 will now be described in more detail with reference to FIG. 13.

Figure 13:
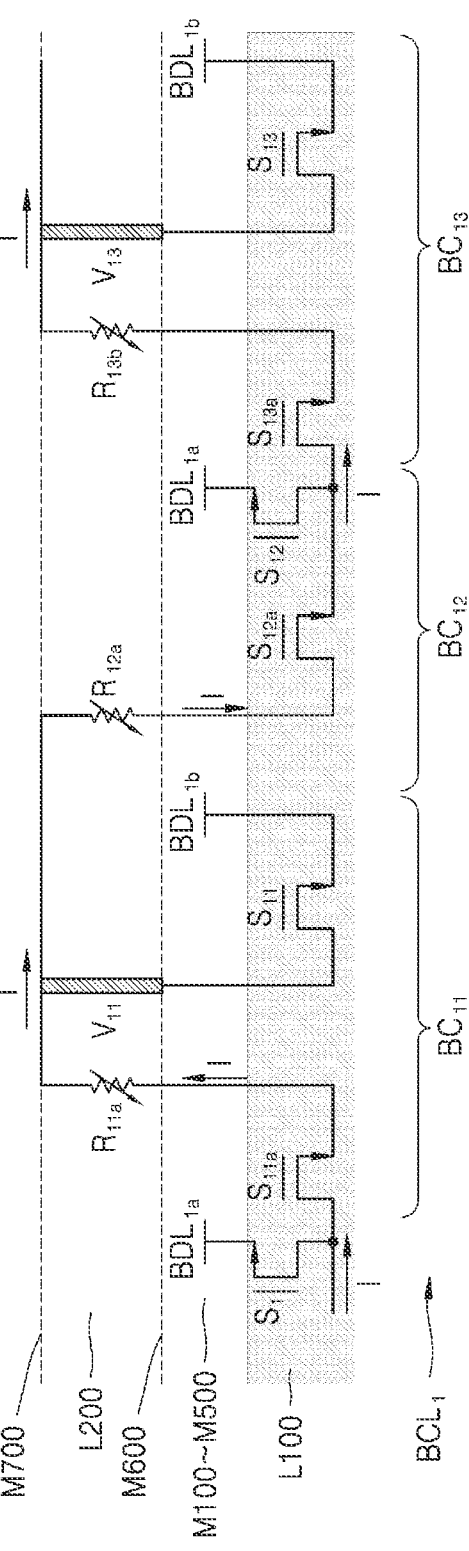
FIG. 13 illustrates an example of a connection relationship between a variable resistor and a switch.

FIG. 13 illustrates an example of a connection relationship between a variable resistor and a switch (e.g., cross-sections of an active layer, a variable resistor layer, and metal layers of the processing device 300 of FIG. 12).

Referring to FIG. 13, the current I flowing in the first bitcell line $BCL_1$ may pass the first variable resistor $R_{11a}$ through the first switch $S_{11a}$ within the first bitcell $BC_{11}$. One end (upper end portion) of the first variable resistor $R_{11a}$ of the first bitcell $BC_{11}$ may be connected to one end (upper end portion) of the first variable resistor $R_{12a}$ of the second bitcell $BC_{12}$ through the seventh metal layer M700. Accordingly, in contrast with FIG. 7, the current I having passed through the first variable resistor $R_{11a}$ may flow to the first variable resistor $R_{12a}$ of the second bitcell $BC_{12}$ without passing through any switch. The bit-data line switches $S_1$, $S_{11}$, $S_{12}$, and $S_{13}$ may be closed only when a weight is applied, and, in other cases (e.g., when the weight is not applied), may be maintained in an open state. Accordingly, after a weight is applied, the current I may not flow from the bit-data lines $BDL_{1a}$ and $BDL_{1b}$ to the first bitcell line $BCL_1$. The current I that passed through the first variable resistor $R_{12a}$ of the second bitcell $BC_{12}$ may flow to the second variable resistor $R_{13b}$ of the third bitcell $BC_{13}$ through the switches $S_{12a}$ and $S_{13b}$. As described above, in FIG. 13, the current I flowing in the first bitcell line $BCL_1$ may flow without passing through the vias $V_{11}$ and $V_{13}$ formed in the variable resistor layer L200.

The vias $V_{11}$ and $V_{13}$ of FIG. 13 may provide a path for changing the resistance values of the variable resistors $R_{11a}$, $R_{12a}$, etc. For example, the first via $V_{11}$ may be used while the resistance value of the second variable resistor $R_{12a}$ of FIG. 13 is being changed. An example method of changing the resistance value of a variable resistor when a weight is applied to a bitcell has been described above in relation to the bitcell BC of FIG. 3. Referring back to FIG. 12, to change the resistance value of the second variable resistor $R_{12a}$, both ends of the second variable resistor $R_{12a}$ may be connected to the first and second bit-data lines $BDL_{1a}$ and $BDL_{1b}$. For example, the upper end portion of the second variable resistor $R_{12a}$ may be connected to the second bit-data line $BDL_{1b}$ through the first bit-data line switch $S_{11}$, and the lower end portion of the second variable resistor $R_{12a}$ may be connected to the first bit-data line $BDL_{1a}$ though the first switch $S_{12a}$ and the second bit-data line switch $S_{12}$ of the second bitcell $BC_{12}$. Referring to FIG. 13, the upper end portion of the second variable resistor $R_{12a}$ may be connected to the first bit-data line switch $S_{11}$ through the first via $V_{11}$. In other words, it may be seen from FIG. 13 that the vias $V_{11}$ or $V_{13}$ may provide a path that connects any variable resistor, of a bitcell including the via $V_{11}$ or $V_{13}$ to corresponding bit-data line switch among bit-data line switches corresponding to the bitcell.

When the number of vias formed in the variable resistor layer L200 is compared between each of the bitcells of FIG. 13 and each of the bitcells of FIG. 7, FIG. 7 illustrates that each of the bitcells includes one via, whereas FIG. 13 illustrates that every two bitcells include one via. In detail, the first bitcell $BC_1$ and the second bitcell $BC_{12}$ of FIG. 13 may include only one via $V_{11}$. Although the bitcell line $BCL_1$ of FIG. 13 is illustrated as having a structure in which a via is formed in an odd-numbered bitcell like the first and third bitcells $BC_1$ and $BC_{13}$, the bitcell line $BCL_1$ of FIG. 13 may have a structure including a via formed in the variable resistor layer of an even-numbered bitcell.

Figure 14:
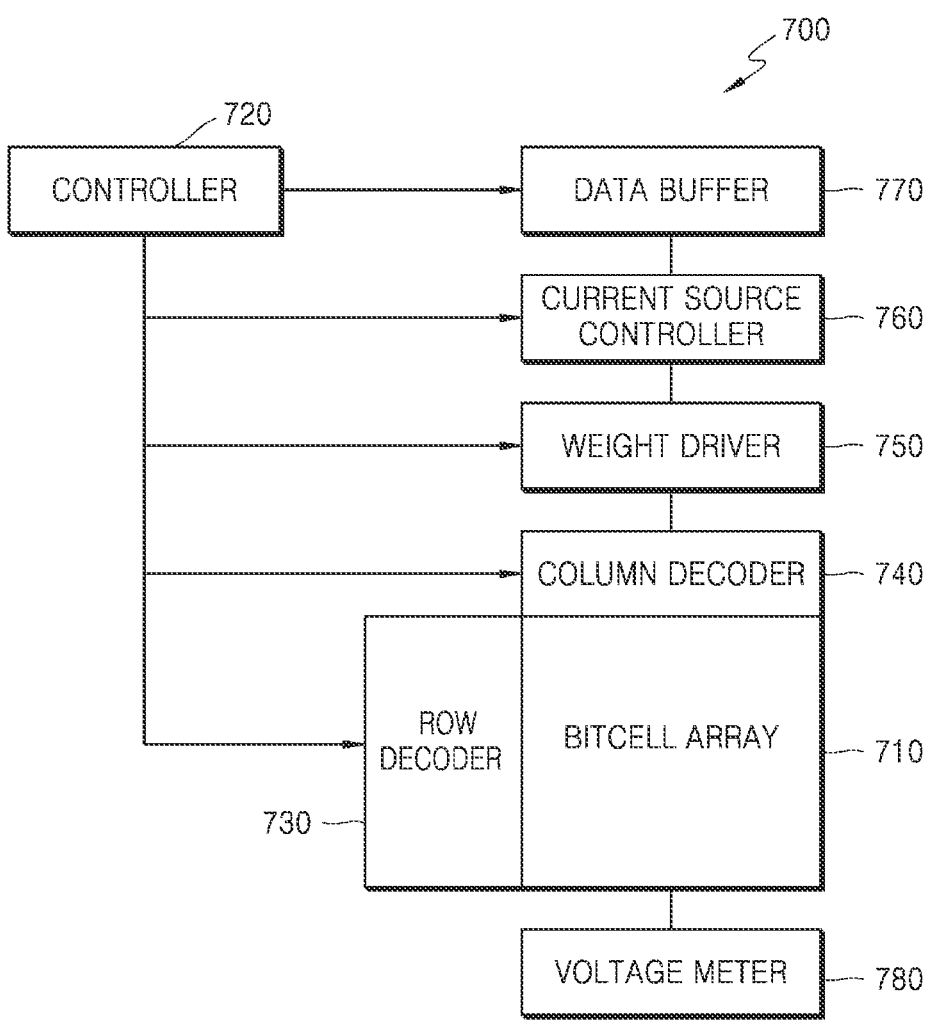
FIG. 14 illustrates an example of a processing device.

FIG. 14 illustrates an example of a processing device (e.g., a processing device 700).

Referring to FIG. 14, the processing device 700 may include a bitcell array 710, a controller 720, a row decoder 730, a column decoder 740, a weight driver 750, a current source controller 760, a data buffer 770, and a voltage meter 780. The processing device 700 illustrated in FIG. 14 may include constituent elements related to the above-described embodiments. However, the disclosure is not limited thereto, and the processing device 700 may further include general-purpose constituent elements other than the constituent elements illustrated in FIG. 14.

The controller 720 may decode instructions for driving and operation of the processing device 700. For example, the controller 720 may decode instructions such as weight setting, weight setting test, input application, voltage measurement, etc., and transmits signals to elements for executing these instructions.

The bitcell array 710 may be an array of bitcells including the above-described variable resistors and switches. The variable resistor may be an MTJ device having a magnetic material.

The row decoder 730 may receive a row address and an input signal and apply an input value to the bitcell array 710. The row decoder 730 may include a digital-to-analog converter (DAC) or an analog-to-digital converter (ADC), and may apply a driving voltage to the switch serially connected to the variable resistor, on the basis of the input value. Furthermore, the row decoder 730 may change the resistance value of a variable resistor included in the bitcell of the bitcell array 710. In this state, the row decoder 730 may apply a driving voltage to related switches so that a target variable resistor is selected.

The column decoder 740 may receive a column address and a weight setting signal and apply a voltage/current to the variable resistor. The column decoder 740 may select a bitcell line for voltage measurement, and a weight line connected to the bitcell for weight setting.

The weight driver 750, during weight setting, may transmit weight data to a bitcell selected by the row decoder 730 and the column decoder 740. The weight driver 750 may drive the weight line connected to the column decoder 740, based on the data received from the data buffer 770, and perform setting of a weight and a test of the set weight. The weight driver 750 may include a current source for applying a test current to the weight line, in order to test whether a desired resistance value is set to the variable resistor.

The current source controller 760 may receive signals from the controller 720 to drive the current source, and apply a current to the bitcell line.

The voltage meter 780 may measure the voltage of the resistor or a capacitor connected to one terminal of the bitcell line, and store a measurement value in an external memory (not shown). The voltage meter 780 may include an ADC that outputs a measurement value as a digital value. The processing device 700 may be or include any of the processing devices mentioned above, such as the processing device 100, 200, or 300.

Figure 15:
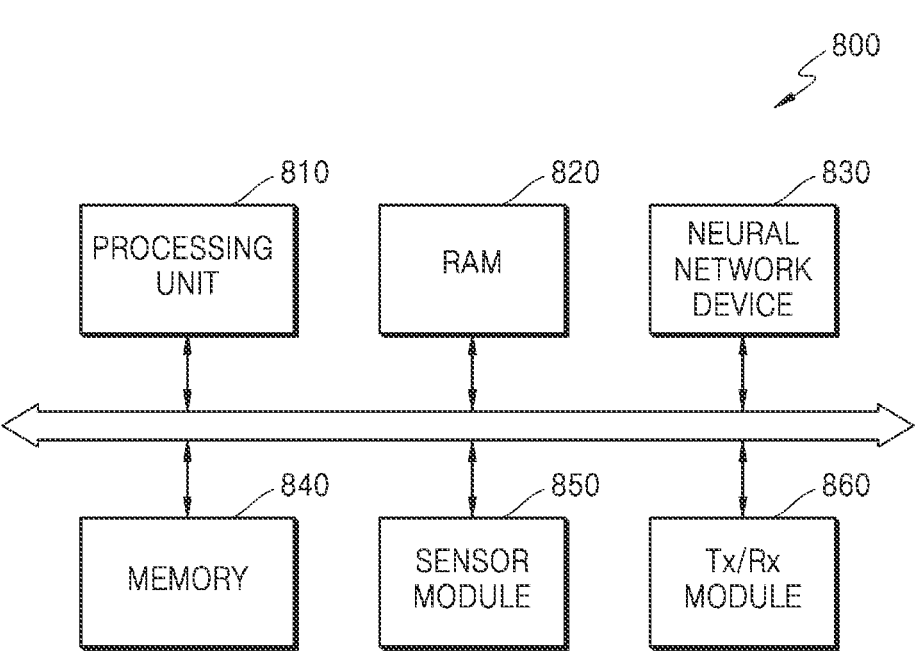
FIG. 15 illustrates an example of an electronic device.

FIG. 15 illustrates an example of an electronic device (e.g., an electronic device 800).

Referring to FIG. 15, the electronic device 800 may extract valid information by analyzing input data on the basis of a neural network device 830 including (or as) the processing device, determine a situation on the basis of extracted information, or control elements of an electronic system equipped with the electronic device 800. For example, the electronic device 800 may be applied to in drones, robot apparatuses (such as advanced driver-assistance systems (ADASs)), smart televisions (TVs), smartphones, medical devices, mobile devices, image display devices, measuring devices, and IoT devices, and may be mounted in at least one of various other kinds of electronic devices.

The electronic device 800 may include a processing unit 810 (e.g., one or more processors), a random access memory (RAM) 820, a memory 840, a sensor module 850, and a communication (Tx/Rx) module 860 in addition to a neural network device 830. The electronic device 800 may further include an input/output module, a security module, a power control device, etc. Some of the hardware components of the electronic device 800 may be mounted on a semiconductor chip. The neural network device 830 may be a device implemented as an on-chip type of the processing device according to the above-described embodiments, or a device including the processing device according to the above-described embodiments as a part.

The processing unit 810 may control overall operations of the electronic device 800. The processing unit 810 may be a central processing unit (CPU), and may include a single processor core or a plurality of processor cores. The processing unit 810 may process or execute programs and/or data stored in the memory 840. The processing unit 810 may control the function of the neural network device 830 by executing the programs stored in the memory 840. The processing unit 810 may be implemented by a graphic processing unit (GPU), an application processor (AP), or the like instead of a CPU.

The RAM 820 may temporarily store programs, data, or instructions. For example, the programs and/or data stored in the memory 840 may be temporarily stored in the RAM 820 under the control of the processing unit 810 or according to a boot code. The RAM 820 may be implemented by a memory device such as DRAM or SRAM.

The neural network device 830 may perform an operation of a neural network, based on the received input data, and may generate an information signal, based on a result of the operation. The neural network device 830 may include the processing device according to the above-described embodiments (e.g., any of the processing devices 100, 200, 300, or 700). The neural network may be, but is not limited to, a convolution neural network (CNN), a recurrent neural network (RNN), a deep belief network, or a restricted Boltzman machine. The neural network device 830 may correspond to a neural network dedicated hardware accelerator.

The information signal may include various kinds of recognition signals such as a voice recognition signal, an object recognition signal, an image recognition signal, and a bio-information recognition signal. For example, the neural network device 830 may receive frame data included in a video stream as input data, and may generate a recognition signal regarding an object included in an image represented by the frame data. The neural network device 830 may receive various kinds of input data according to the types or functions of electronic system in which the electronic device 800 is mounted, and may generate recognition signals according to the various kinds of input data.

The memory 840 is a storage for storing data, and may store, for example, an operating system (OS), various kinds of programs, and various kinds of data. The memory 840 may include a volatile and/or nonvolatile memory. Examples of the nonvolatile memory may include read only memory (ROM), programmable ROM (PROM), electrically programmable ROM (EPROM), electrically erasable and programmable ROM (EEPROM), flash memory, phase-change random access memory (PRAM), magnetic random access memory (MRAM), resistive random access memory (RRAM), and ferroelectric random access memory (Fe-RAM). Examples of the volatile memory may include DRAM, static random access memory (SRAM), synchronous DRAM (SDRAM), PRAM, MRAM, RRAM, and FeRAM. The memory 840 may include, for example, a hard disk drive (HDD), a solid state drive (SSD), a compact flash (CF), a secure digital (SD) card, a micro-secure digital (Micro-SD) card, a mini-secure digital (Mini-SD) card, an extreme digital (xD) card, or a memory stick.

The sensor module 850 may collect information about the surroundings of the electronic systems in which the electronic device 800 is mounted. The sensor module 850 may sense or receive a signal, such as an image signal, a voice signal, a magnetic signal, a biometric signal, or a touch signal, from outside the electronic device, and may convert the sensed or received signal to data. To this end, the sensor module 850 may include any of various types of sensing devices, such as a microphone, a photographing device, an image sensor, a light detection and ranging (LIDAR) sensor, an ultrasonic sensor, an infrared sensor, a biosensor, or a touch sensor.

The sensor module 850 may provide the neural network device 830 with the converted data as input data. For example, the sensor module 850 may include an image sensor, and may generate a video stream by photographing the external environment of the electronic device and provide the neural network device 830 with consecutive data frames of the video stream in order as input data. However, the sensor module 850 is not limited thereto, and the sensor module 850 may provide various other types of data to the neural network device 830.

The Tx/Rx module 860 may include various wired or wireless interfaces capable of communicating with external devices. For example, the Tx/Rx module 860 may include a local area network (LAN), a wireless local area network (WLAN) such as Wi-Fi, wireless fidelity (Wi-Fi), a wireless personal area network (WPAN) such as Bluetooth, a wireless universal serial bus (USB), ZigBee, near-field communication (NFC), radio-frequency identification (RFID), power-line communication (PLC), or a communication interface capable of connecting to a mobile cellular network such as 3rd generation (3G), 4th generation (4G), long-term evolution (LTE), or 5th Generation (5G).

The electronic device 800 may include a processor, a memory device for storing program data and executing it, a permanent storage such as a disk drive, a communications port for handling communications with external devices, and user interface devices, including a touch panel, keys, buttons, etc. For example, when software modules or algorithms are involved, these software modules may be stored as program instructions or computer readable codes executable on the processor in a computer-readable recording medium.

The processing devices, neural network devices, electronic devices, bitcells, bitcell lines, switches, variable resistors, layers, pinned layers, tunnel layers, free layers, active layers, metal layers, variable resistor layers, vias, bitcell arrays, controllers, row decoders, column decoders, weight drivers, current source controllers, data buffers, voltage meters, processing units, RAMs, memories, sensor modules, communication (Tx/Rx) modules, processing device 200, processing device 300, processing device 700, bitcell array 710, controller 720, row decoder 730, column decoder 740, weight driver 750, current source controller 760, data buffer 770, voltage meter 780, electronic device 800, processing unit 810, RAM 820, neural network device 830, memory 840, sensor module 850, communication (Tx/Rx) module 860, and other apparatuses, devices, units, modules, and components described herein with respect to FIGS. 1-15 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-15 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above.

In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), programmable random-access read only memory (PROM), electrically erasable programmable read-only memory (EE-PROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), a card type memory such as multimedia card or a micro card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A processing device comprising:
a plurality of bitcells, each of the plurality of bitcells including:
a variable resistor layer including a plurality of active variable resistors and a plurality of inactive variable resistors;
an active layer including a plurality of switches configured to control either one of a voltage to be applied between ends of each of the active variable resistors and a current flowing to each of the active variable resistors; and
a plurality of metal layers including wires electrically connecting the active variable resistors to the switches,
wherein at least one of the plurality of bitcells comprises a via penetrating through the variable resistor layer and directly connecting at least one of the switches of the at least one of the plurality of bitcells to at least one of the active variable resistors of another one of the plurality of bitcells.

2. The processing device of claim 1, wherein configurations of the via, the active variable resistors, and the inactive variable resistors of adjacent bitcells among the at least one of the plurality of bitcells are symmetrical with each other about a boundary between the adjacent bitcells.

3. The processing device of claim 1, wherein each of the plurality of bitcells respectively comprises the via.

4. The processing device of claim 1, wherein
the plurality of bitcells comprise serially connected bitcells, and
the serially connected bitcells comprise one via for every two adjacent bitcells.

5. The processing device of claim 1, wherein the plurality of bitcells comprise 64 or more serially connected bitcells.

6. The processing device of claim 1, wherein
the plurality of bitcells form a bitcell array including 64 or more bitcell lines, and
each of the bitcell lines comprises serially connected bitcells from among the plurality of bitcells.

7. The processing device of claim 1, wherein at least one of the switches of each of the plurality of bitcells comprises a common source and two electrically connected drains.

8. The processing device of claim 1, wherein the processing device is an in-memory processing unit.

9. An electronic device comprising:
the processing device of claim 1, wherein the processing device is a neural network device; and
a processor configured to control a function of the neural network device.

10. A processing device comprising:
a bitcell including:
a variable resistor layer including a plurality of active variable resistors;
an active layer including a plurality of switches configured to control either one of a voltage to be applied between ends of each of the active variable resistors and a current flowing to each of the active variable resistors; and a plurality of metal layers including wires electrically connecting the active variable resistors to the switches, wherein the variable resistor layer comprises at least one via penetrating through the variable resistor layer and directly connecting at least one of the switches of the bitcell to at least one active variable resistor of another bitcell.

11. The processing device of claim 10, wherein the metal layers comprise a metal layer stacked on the variable resistor layer and including a wire connecting an upper end portion of the via to an upper end portion of at least one of the active variable resistors.

12. The processing device of claim 11, wherein the variable resistor layer further comprises inactive variable resistors not electrically connected to the switches, and a minimum distance between the at least one via and the active variable resistors is greater than a minimum distance between the at least one via and the inactive variable resistors.

13. The processing device of claim 12, wherein the variable resistor layer comprises a plurality of vias, and a minimum distance between vias is less than the minimum distance between the at least one via and the inactive variable resistors.

14. The processing device of claim 12, wherein the minimum distance between the at least one via and the inactive variable resistors is greater than both a minimum distance between the inactive variable resistors and a minimum distance between the inactive variable resistors and the active variable resistors.

15. The processing device of claim 12, wherein the variable resistor layer comprises a plurality of vias, and a minimum distance between the vias is substantially within 0.10 μm to 0.40 μm.

16. The processing device of claim 12, wherein the minimum distance between the at least one via and the active variable resistors is substantially within 0.50 μm to 1.20 μm.

17. The processing device of claim 12, wherein the minimum distance between the at least one via and the inactive variable resistors is substantially within 0.30 μm to 0.60 μm.

18. The processing device of claim 10, wherein each of the active variable resistors is a magnetic tunnel junction (MTJ) device.

19. An electronic device comprising:

the processing device of claim 10, wherein the processing device is a neural network device; and a processor configured to control a function of the neural network device.

20. An electronic device comprising:

a neural network device; and a processor configured to control a function of the neural network device, wherein the neural network device comprises a plurality of bitcells, each of the plurality of bitcells including:

a variable resistor layer including a plurality of active variable resistors and a plurality of inactive variable resistors;

an active layer including a plurality of switches configured to control either one of a voltage to be applied to ends of each of the active variable resistors and a current flowing to each of the active variable resistors; and a plurality of metal layers including wires electrically connecting the active variable resistors to the switches, and wherein at least one of the plurality of bitcells comprises a via penetrating through the variable resistor layer and directly connecting at least one of the switches of the at least one of the plurality of bitcells to at least one of the active variable resistors of another one of the plurality of bitcells.

21. The electronic device of claim 20, wherein configurations of the via, the active variable resistors, and the inactive variable resistors of adjacent bitcells among the at least one of the plurality of bitcells are symmetrical with each other about a boundary between the adjacent bitcells.

22. The electronic device of claim 20, wherein each of the plurality of bitcells comprises two of the active variable resistors connected to each other in parallel and two of the switches serially connected to the active variable resistors, respectively.

23. The electronic device of claim 20, wherein each of the plurality of bitcells respectively comprises the via.

24. The electronic device of claim 20, wherein the plurality of bitcells comprise serially connected bitcells, and the serially connected bitcells comprise one via for every two adjacent bitcells.

25. The electronic device of claim 20, wherein the plurality of bitcells comprise 64 or more serially connected bitcells.

26. The electronic device of claim 20, wherein the plurality of bitcells form a bitcell array including 64 or more bitcell lines, and each of the bitcell lines comprises serially connected bitcells from among the plurality of bitcells.

27. The electronic device of claim 20, wherein at least one of the switches of each of the plurality of bitcells comprises a common source and two electrically connected drains.

28. An electronic device comprising:

a neural network device; and a processor configured to control a function of the neural network device, wherein the neural network device comprises a bitcell including:

a variable resistor layer including a plurality of active variable resistors and a plurality of inactive variable resistors;

an active layer including a plurality of switches configured to control either one of a voltage to be applied to both ends of each of the active variable resistors and a current flowing to each of the active variable resistors; and a plurality of metal layers including wires electrically connecting the active variable resistors to the switches, and the variable resistor layer comprises at least one via penetrating through the variable resistor layer and directly connecting at least one of the switches of the bitcell to at least one active variable resistor of another bitcell.

29. The electronic device of claim 28, wherein the metal layers comprise a metal layer stacked on the variable resistor layer and including a wire connecting an upper end portion of the via to an upper end portion of at least one of the active variable resistors.

30. The electronic device of claim 29, wherein the inactive variable resistors are not electrically connected to the switches, and a minimum distance between the at least one via and the active variable resistors is greater than a minimum distance between the at least one via and the inactive variable resistors.

31. The electronic device of claim 30, wherein the variable resistor layer comprises a plurality of vias, and a minimum distance between vias is less than the minimum distance between the at least one via and the inactive variable resistors.

32. The electronic device of claim 30, wherein the minimum distance between the at least one via and the inactive variable resistors is greater than both a minimum distance between the inactive variable resistors and a minimum distance between the inactive variable resistors and the active variable resistors.

33. The electronic device of claim 30, wherein the variable resistor layer comprises a plurality of vias, and a minimum distance between the vias is substantially within 0.10 μm to 0.40 μm.

34. The electronic device of claim 30, wherein the minimum distance between the at least one via and the active variable resistors is substantially within 0.50 μm to 1.20 μm.

35. The electronic device of claim 30, wherein the minimum distance between the at least one via and the inactive variable resistors is substantially within 0.30 μm to 0.60 μm.

36. The electronic device of claim 28, wherein each of the active variable resistors is a magnetic tunnel junction (MTJ) device.

37. A processing device comprising:

a plurality of bitcells, wherein at least one of the plurality of bitcells comprises:

a plurality of active variable resistors and a plurality of inactive variable resistors;

a plurality of switches configured to control either one of a voltage to be applied to the active variable resistors and a current flowing to the active variable resistors; and a via serially connecting at least one of the switches to at least one of the active variable resistors, wherein the via is distanced further from the active variable resistors than the inactive variable resistors.

38. The processing device of claim 37, wherein the plurality of bitcells comprises an array of active variable resistors and inactive variable resistors including the active variable resistors and the inactive variable resistors of the at least one of the plurality of bitcells, the active variable resistors of the array are disposed at a center of the array, and the inactive variable resistors of the array surround the active variable resistors of the array.

39. The processing device of claim 38, wherein the array is symmetrical about boundaries between adjacent bitcells of the plurality of bitcells.

40. The processing device of claim 38, wherein at least two bitcells of the plurality of bitcells are of a bitcell line, and at least two other bitcells of the plurality of bitcells are of another bitcell line, and the bitcell line is configured to perform operations of a node of a layer of a neural network, and the other bitcell line is configured to perform operations of another node of the layer of the neural network.

* * * * *